(12) United States Patent
Fulford et al.

(10) Patent No.: US 12,464,704 B2
(45) Date of Patent: Nov. 4, 2025

(54) THREE-DIMENSIONAL PLURALITY OF N HORIZONTAL MEMORY CELLS WITH ENHANCED HIGH PERFORMANCE CIRCUIT DENSITY

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 469 days.

(21) Appl. No.: 17/989,348

(22) Filed: Nov. 17, 2022

(65) Prior Publication Data

US 2023/0320069 A1  Oct. 5, 2023

Related U.S. Application Data

(60) Provisional application No. 63/325,314, filed on Mar. 30, 2022.

(51) Int. Cl.
*H10B 12/00* (2023.01)

(52) U.S. Cl.
CPC ............ *H10B 12/30* (2023.02); *H10B 12/03* (2023.02); *H10B 12/05* (2023.02)

(58) Field of Classification Search
None
See application file for complete search history.

(56) References Cited

U.S. PATENT DOCUMENTS

| | | | |
|---|---|---|---|
| 2019/0103407 A1* | 4/2019 | Kim | H10B 12/30 |
| 2021/0375875 A1* | 12/2021 | Brewer | H10D 30/6757 |
| 2022/0085023 A1* | 3/2022 | Shin | H10B 12/03 |

* cited by examiner

*Primary Examiner* — Yara B Green
*Assistant Examiner* — Coralie A Nettles
(74) *Attorney, Agent, or Firm* — Oblon, McClelland, Maier & Neustadt, L.L.P.

(57) ABSTRACT

Aspects of the present disclosure provide a semiconductor structure, which can include a lower transistor including a lower channel that is elongated horizontally and includes a lower doped first-type semiconductor layer of a lower doped semiconductor layer, an upper transistor vertically stacked over the lower transistor and including an upper channel that is elongated horizontally and includes an upper doped first-type semiconductor layer of an upper doped semiconductor layer, a lower capacitor electrically connected to and horizontally elongated from the lower transistor and including a first lower plate that includes a lower doped second-type semiconductor layer of the lower doped semiconductor layer, and an upper capacitor vertically stacked over the lower capacitor and electrically connected to and horizontally elongated from the upper transistor and including a first upper plate that includes an upper doped second-type semiconductor layer of the upper doped semiconductor layer.

11 Claims, 24 Drawing Sheets

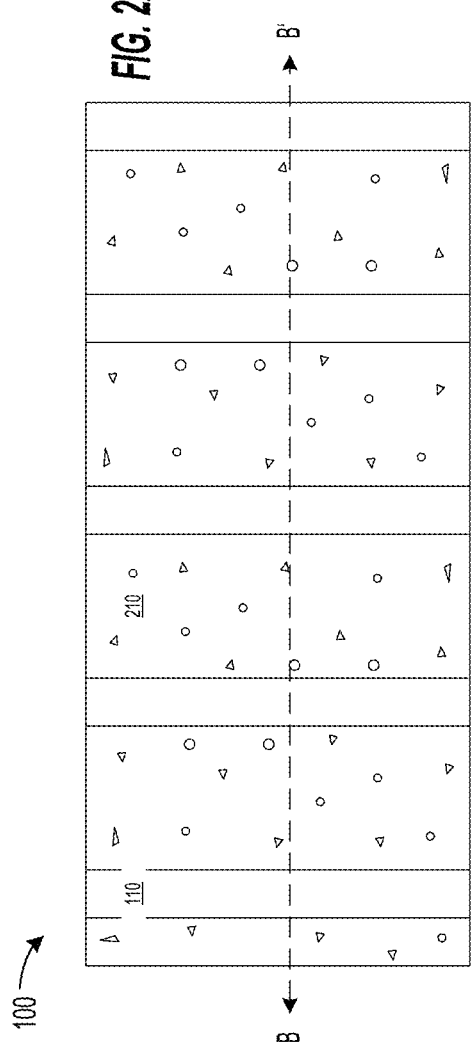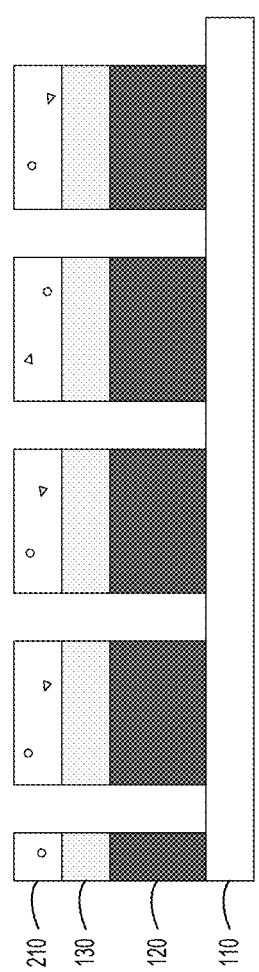

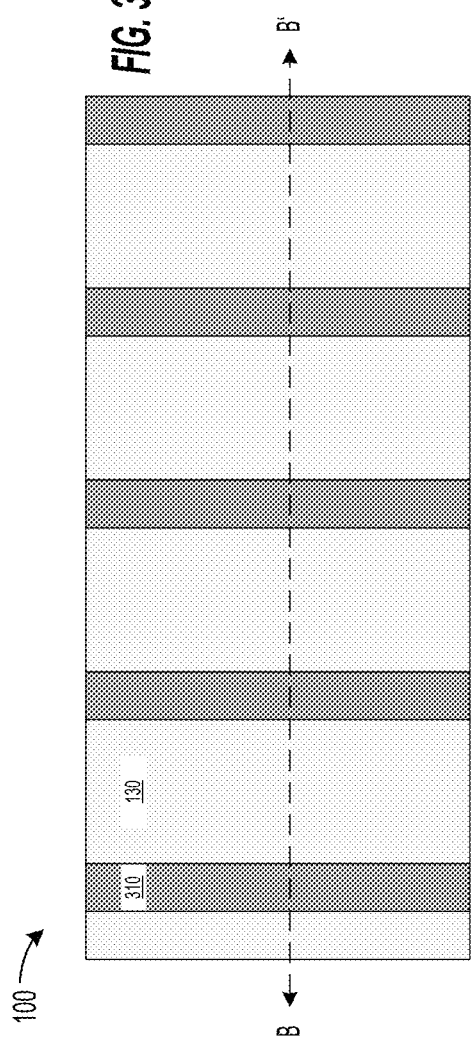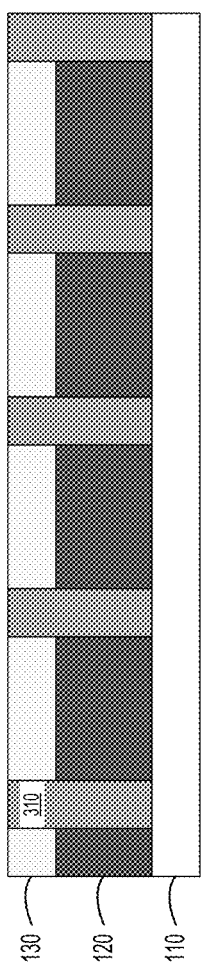

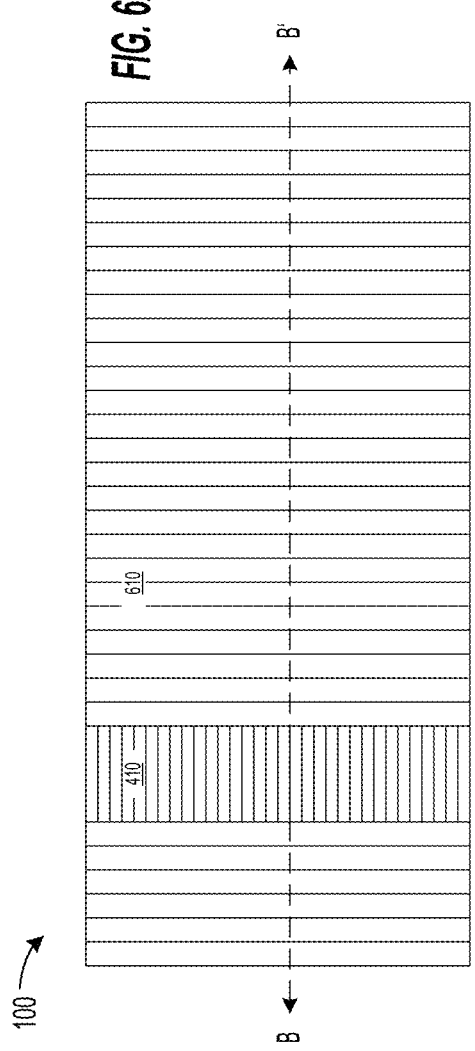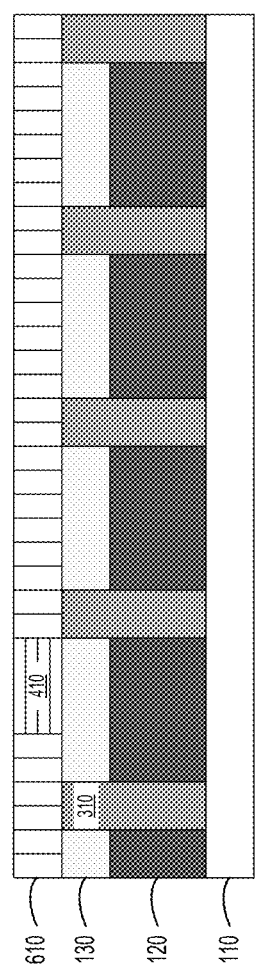

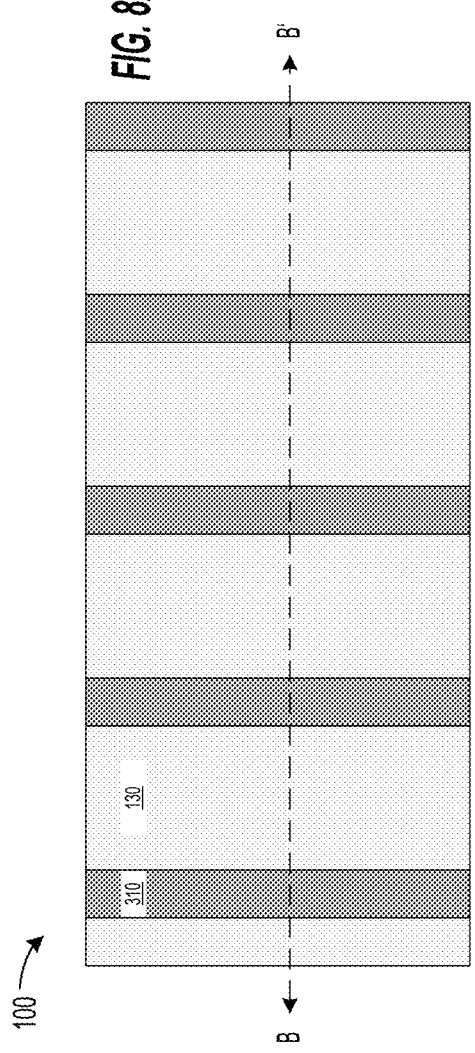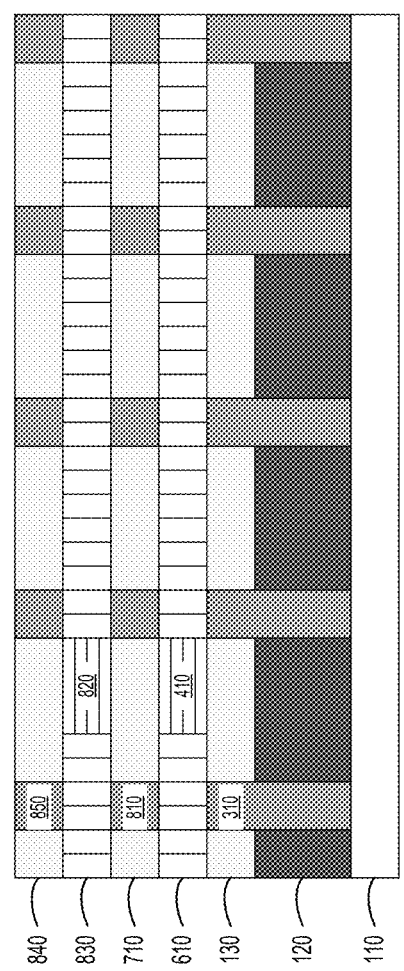

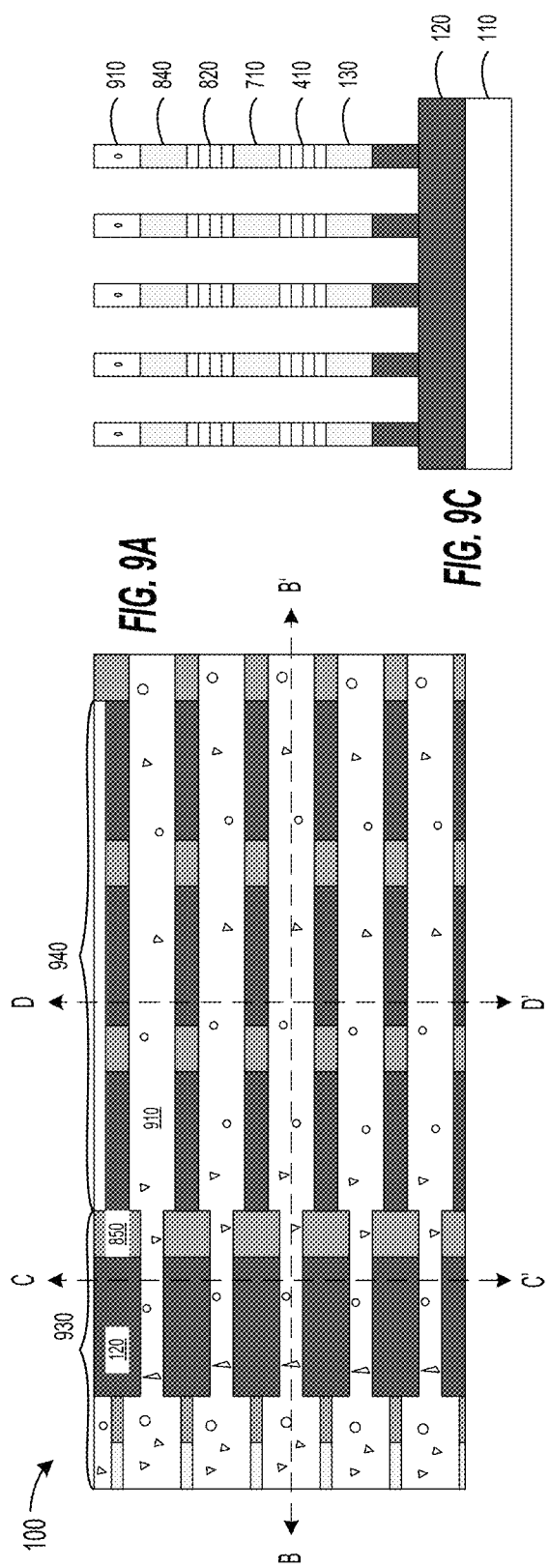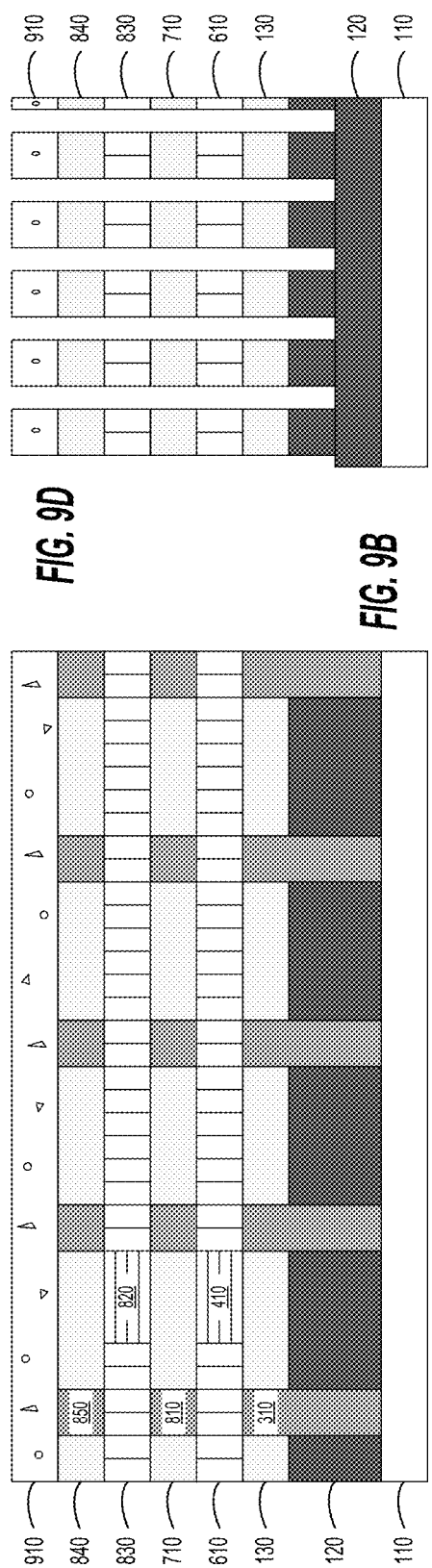

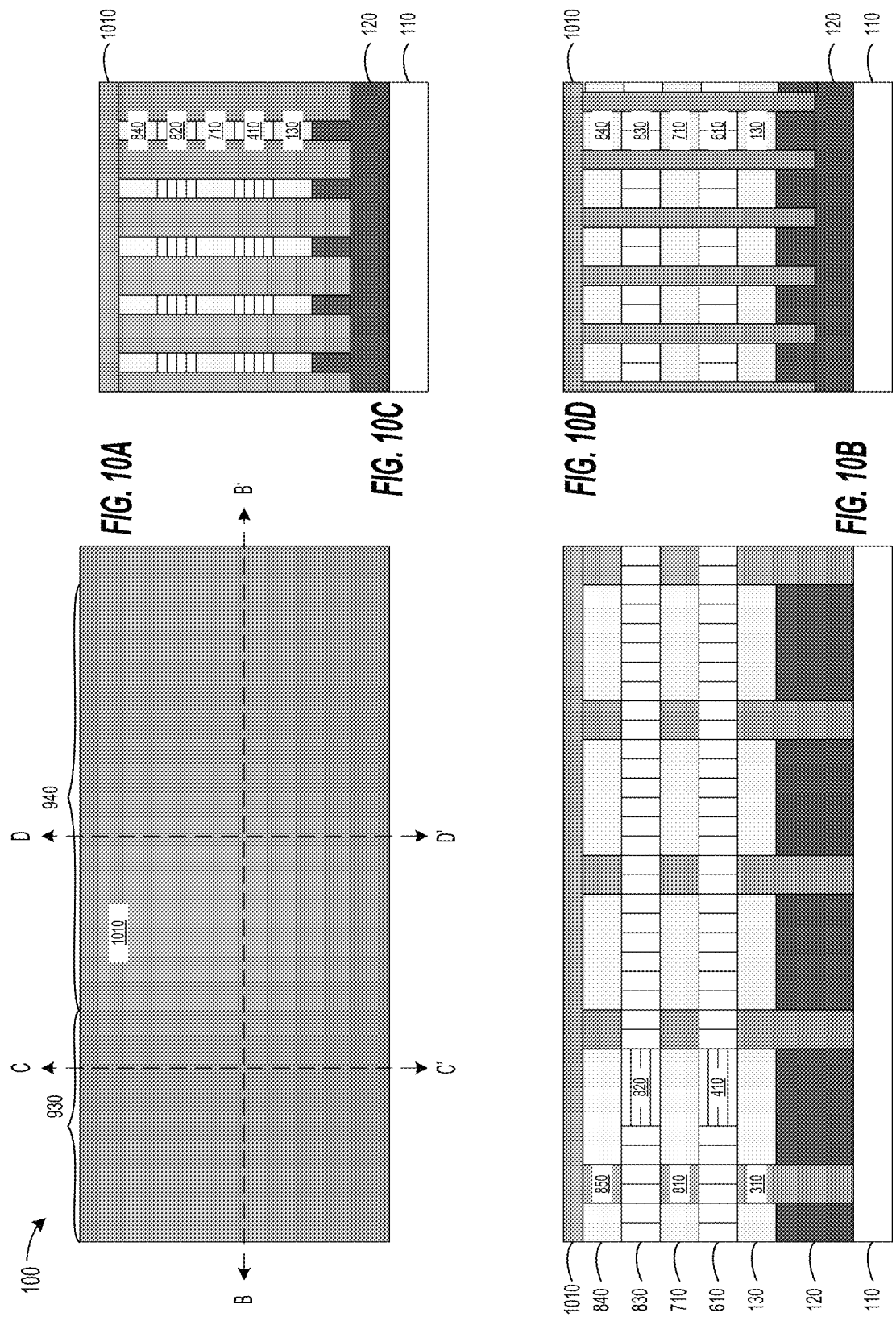

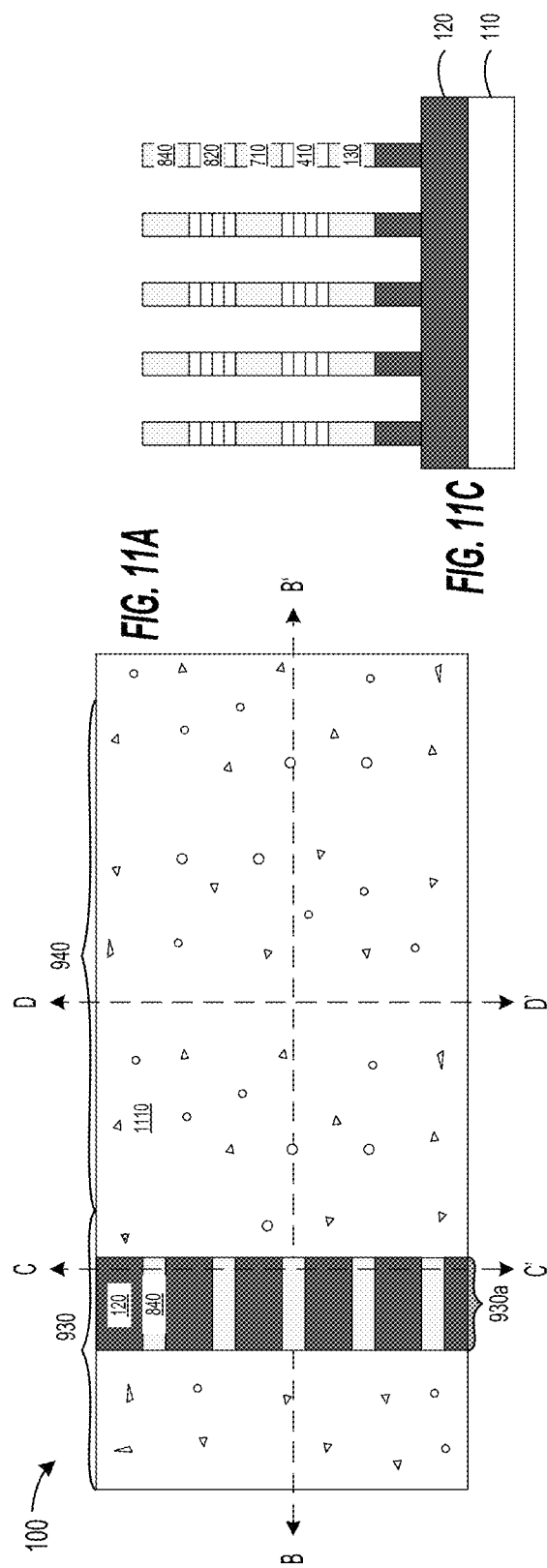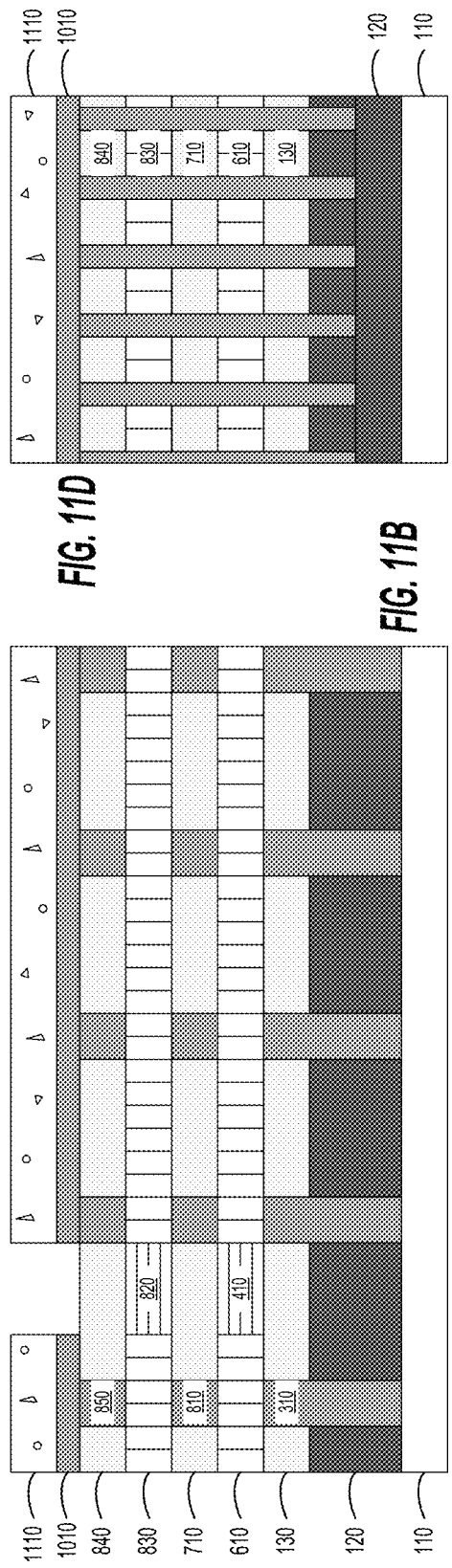
FIG. 11A
FIG. 11C
FIG. 11B
FIG. 11D

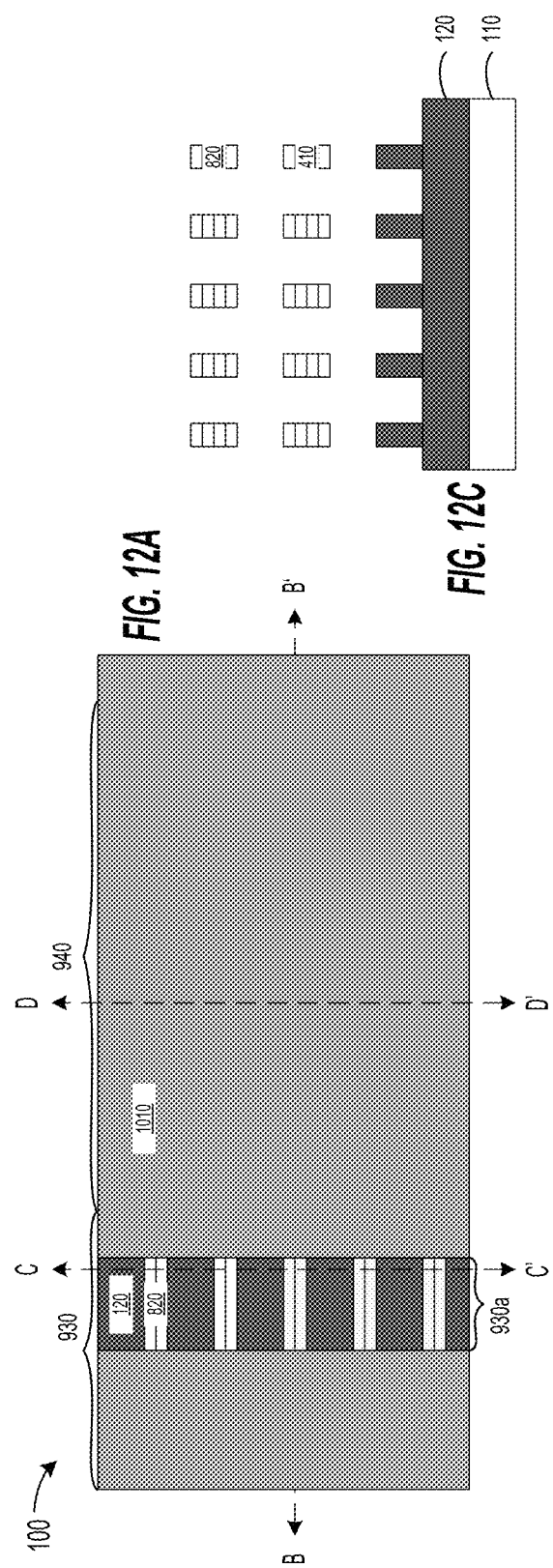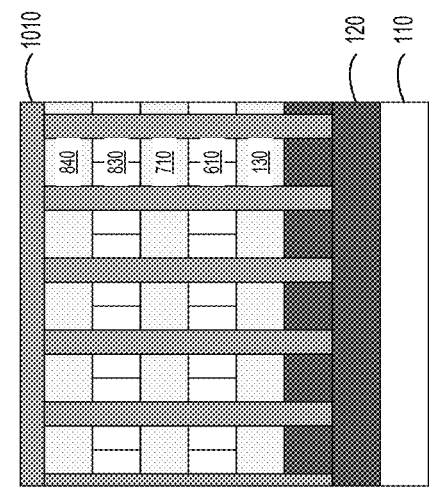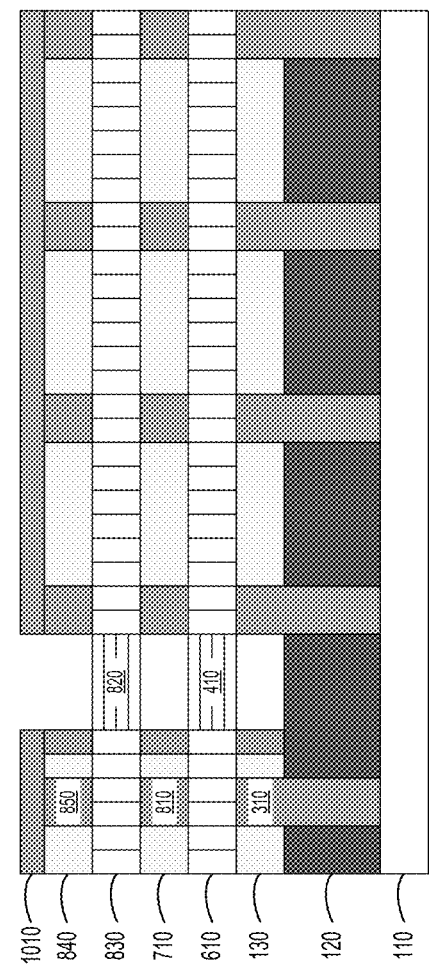
FIG. 12A
FIG. 12C
FIG. 12D
FIG. 12B

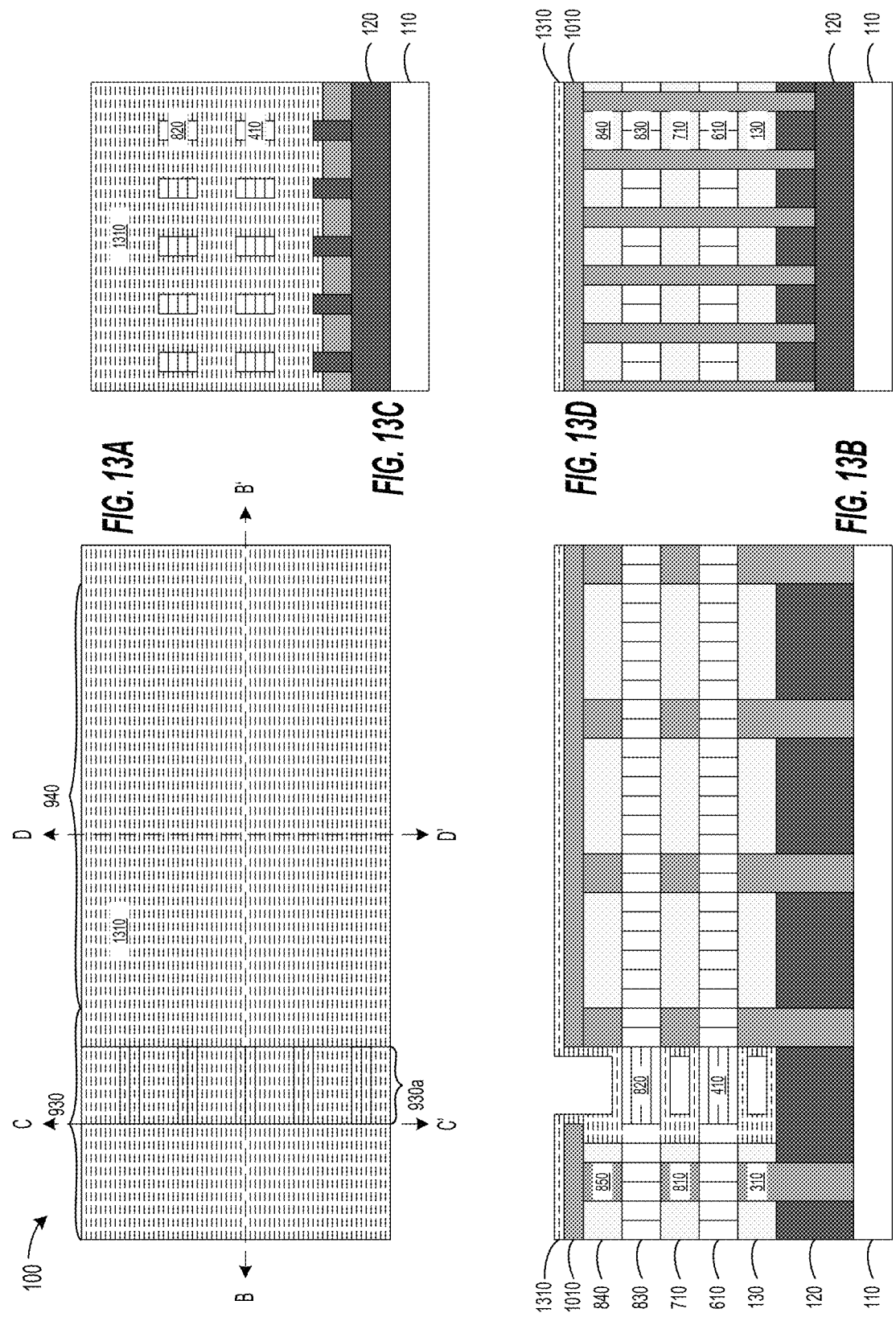

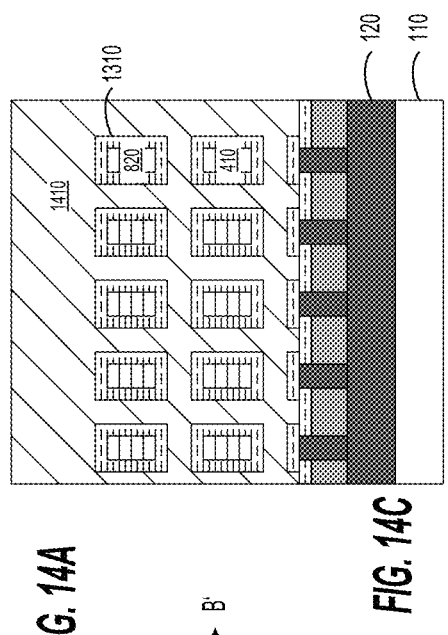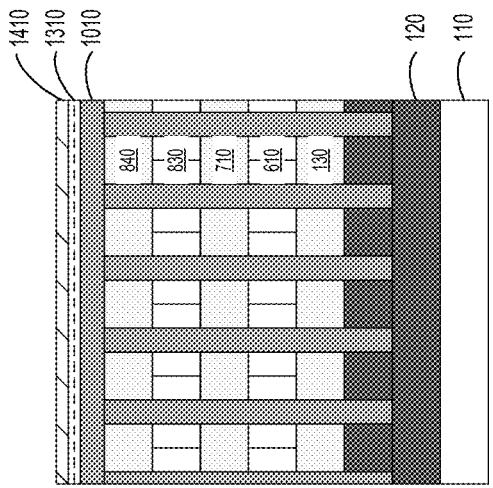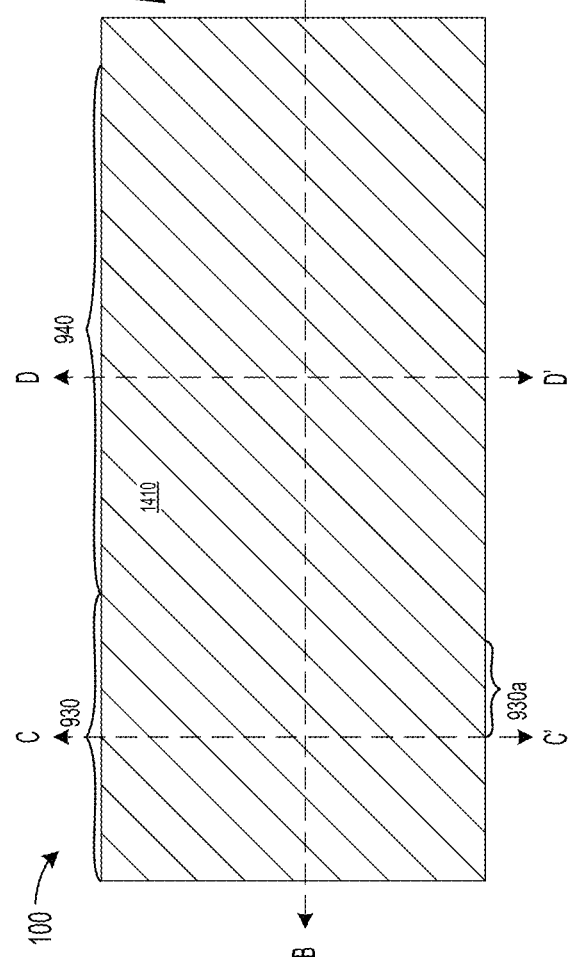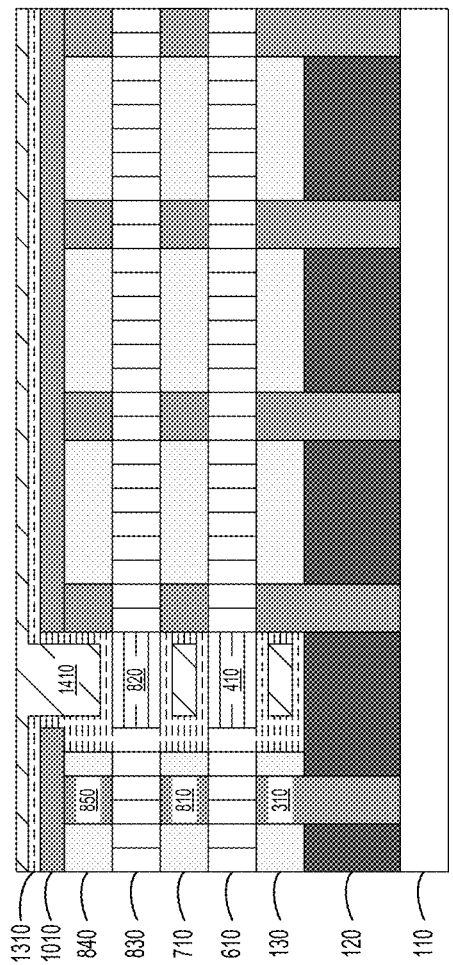
FIG. 14A
FIG. 14C
FIG. 14D
FIG. 14B

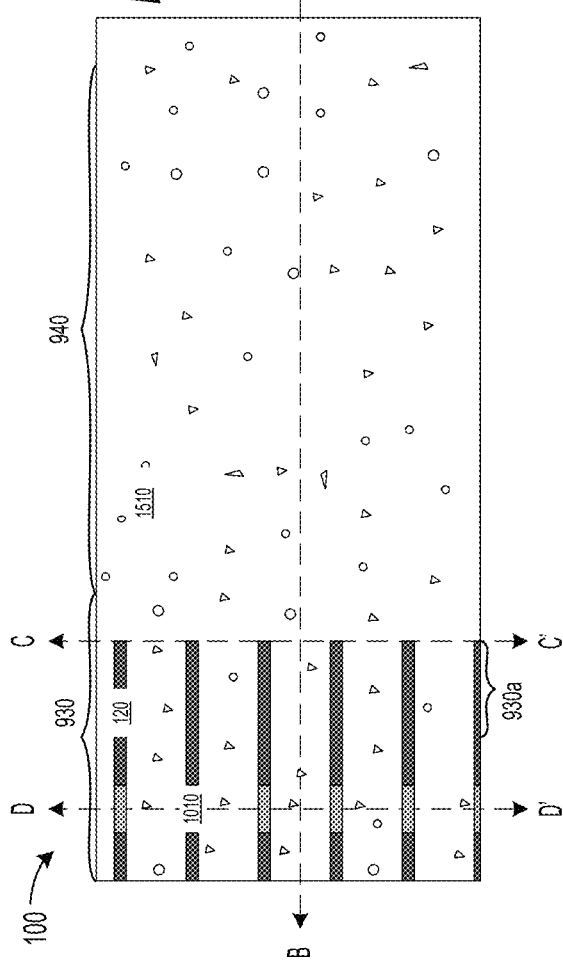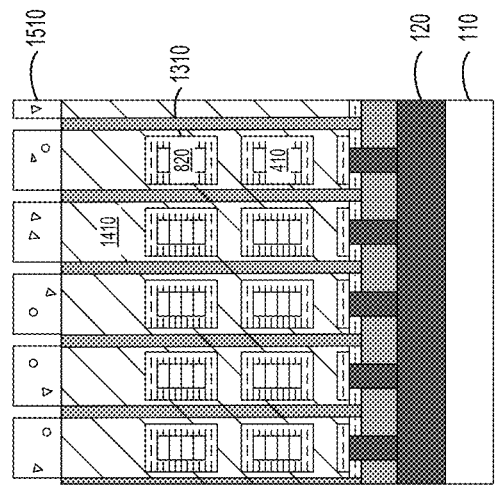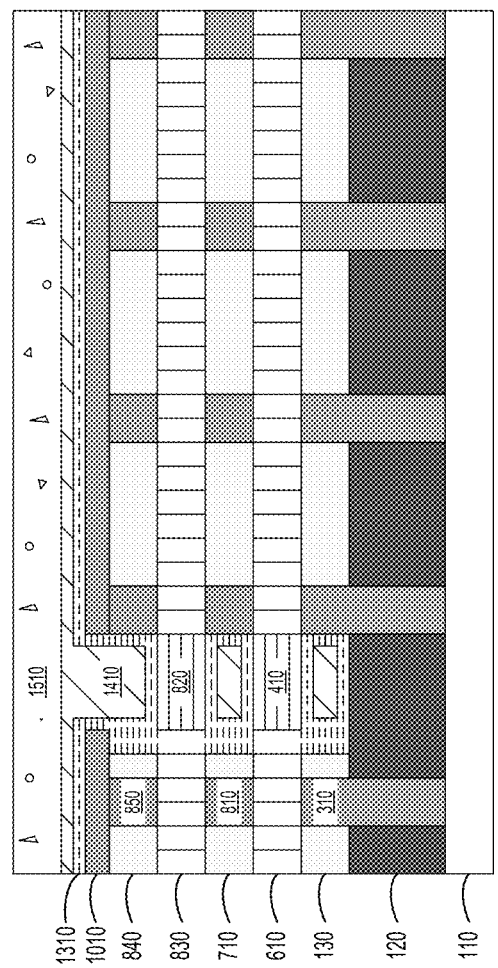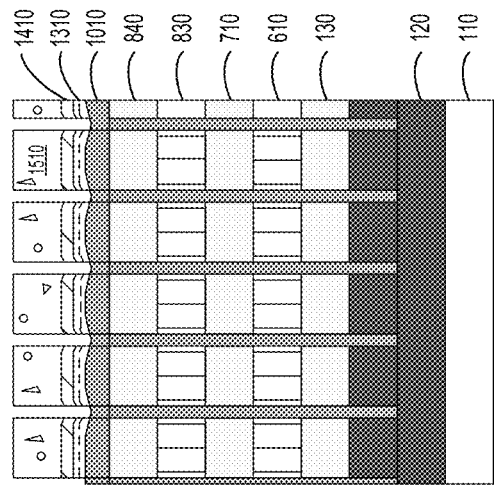
FIG. 15A
FIG. 15C
FIG. 15D
FIG. 15B

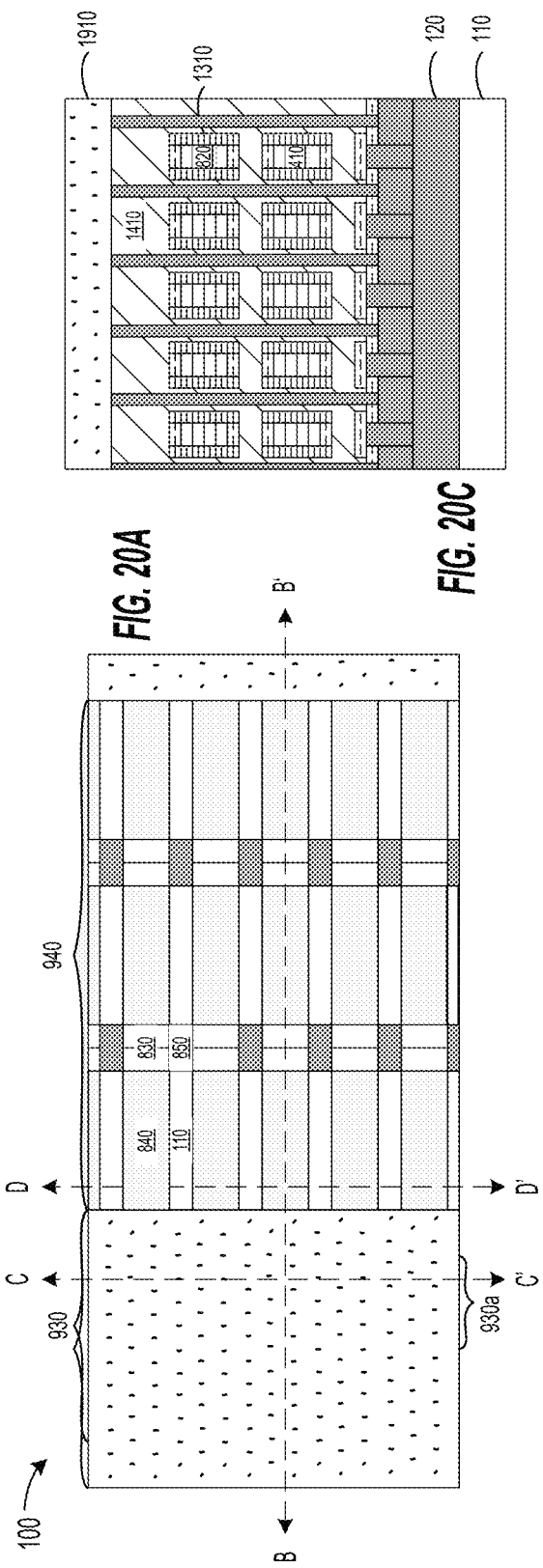
FIG. 20A
FIG. 20C
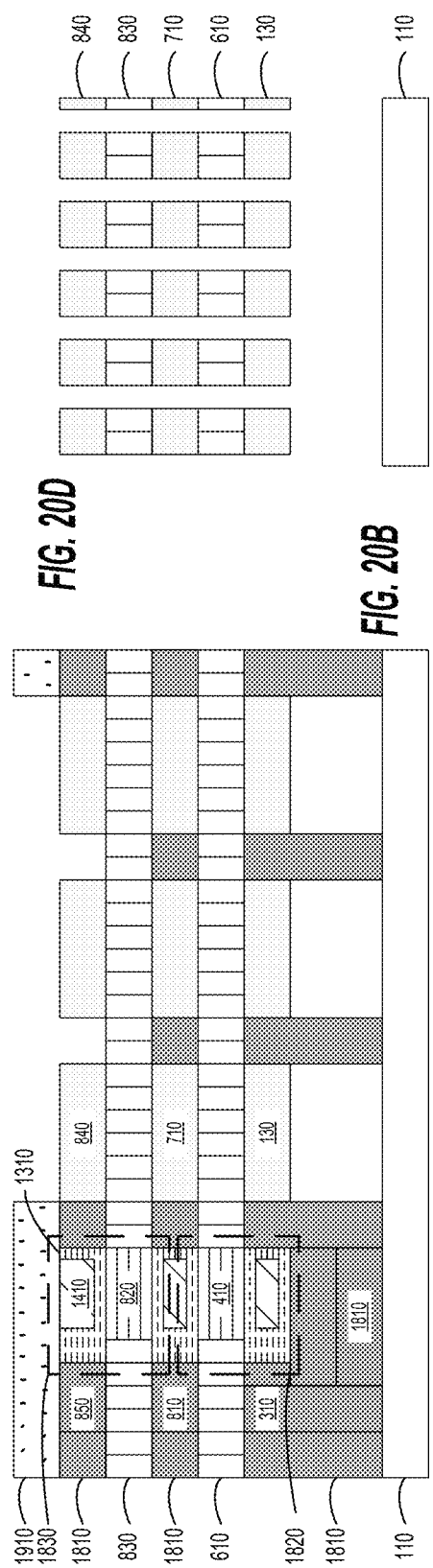
FIG. 20D
FIG. 20B

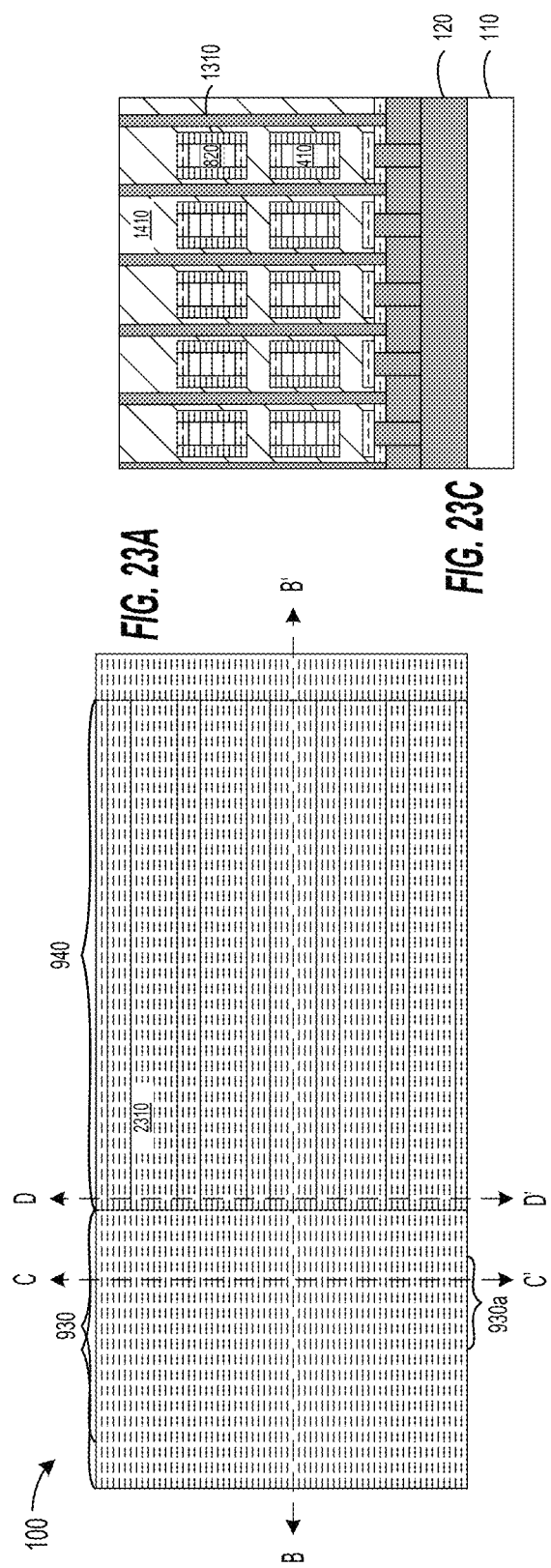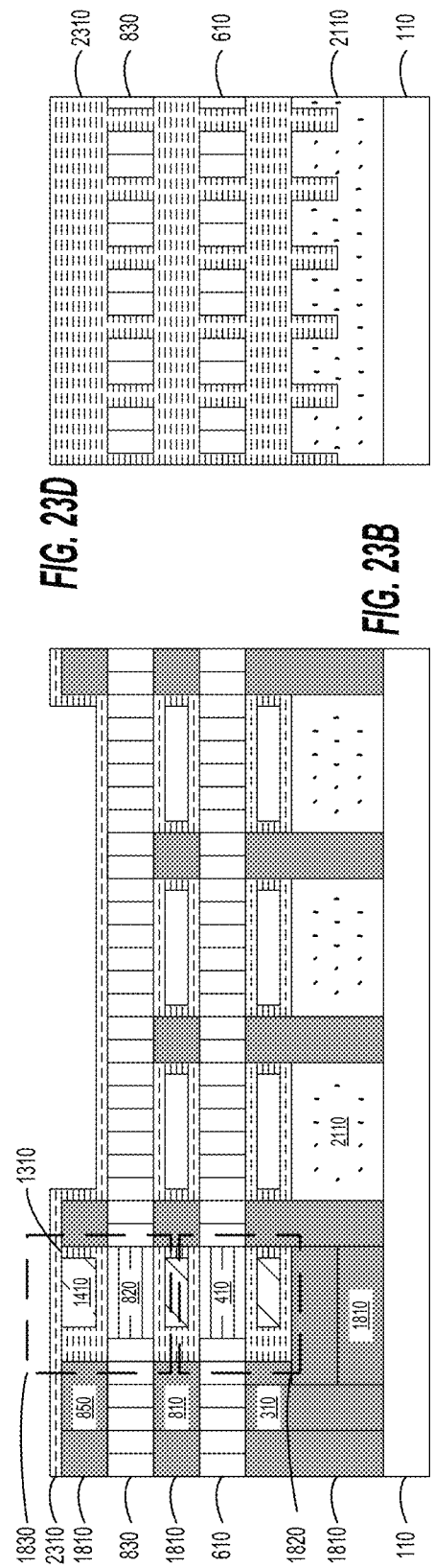

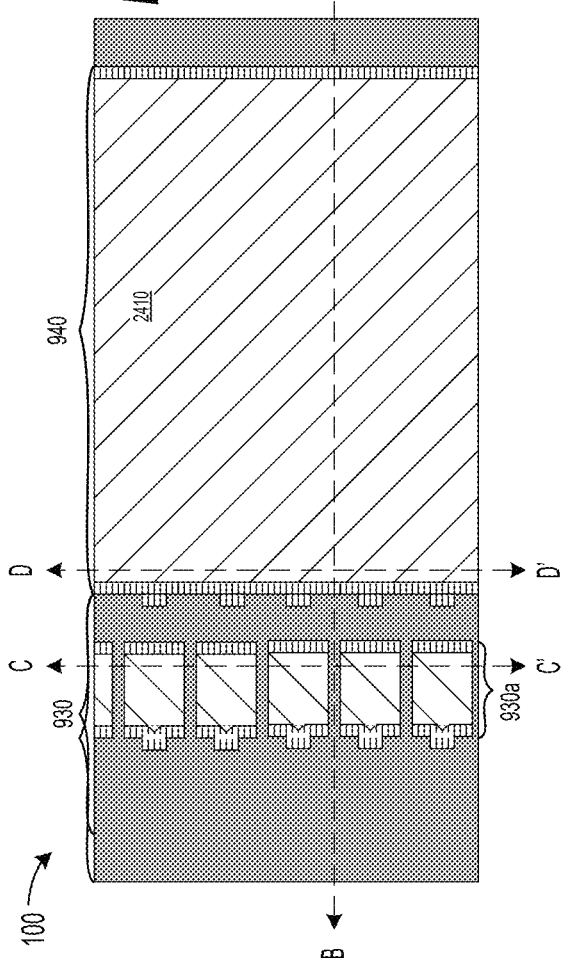

THREE-DIMENSIONAL PLURALITY OF N HORIZONTAL MEMORY CELLS WITH ENHANCED HIGH PERFORMANCE CIRCUIT DENSITY

INCORPORATION BY REFERENCE

This present disclosure claims the benefit of U.S. Provisional Application No. 63/325,314, "3D PLURALITY OF N HORIZONTAL MEMORY CELLS WITH ENHANCED HIGH PERFORMANCE CIRCUIT DENSITY" filed on Mar. 30, 2022, which is incorporated herein by reference in its entirety.

FIELD OF THE INVENTION

This disclosure relates to microelectronic devices including semiconductor devices, transistors, and integrated circuits, including methods of microfabrication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method for fabricating a semiconductor structure. For example, the method can include forming over a substrate a lower stack of a lower semiconductor layer and a lower doped semiconductor layer stacked over the lower semiconductor layer. The lower semiconductor layer and the lower doped semiconductor layer can be parallel to a top surface of the substrate. The lower doped semiconductor layer can include a lower doped first-type semiconductor layer and a lower doped second-type semiconductor layer within a transistor area and a capacitor area of the semiconductor structure, respectively. The lower semiconductor layer can have one or more lower pillars. The method can also include forming over the lower stack an upper stack of an upper semiconductor layer and an upper doped semiconductor layer stacked over the upper semiconductor layer. The upper semiconductor layer and the upper doped semiconductor layer can be parallel to the top surface of the substrate. The upper doped semiconductor layer can include an upper doped first-type semiconductor layer and an upper doped second-type semiconductor layer within the transistor area and the capacitor area of the semiconductor structure, respectively. The upper semiconductor layer can have one or more upper pillars. The method can also include forming over the substrate a lower transistor within the transistor area. The lower transistor can include the lower doped first-type semiconductor layer as a lower channel thereof. The method can also include forming over the lower transistor an upper transistor within the transistor area. The upper transistor can include the upper doped first-type semiconductor layer as an upper channel thereof. The method can also include forming over the substrate a lower capacitor within the capacitor area. The lower capacitor can include the lower doped second-type semiconductor layer as a first lower plate thereof. The method can also include forming over the lower capacitor an upper capacitor within the capacitor area. The upper capacitor can include the upper doped second-type semiconductor layer as a first upper plate thereof. In an embodiment, the lower transistor can be insulated from the substrate.

In an embodiment, the lower transistor can have a lower gate region that wraps around the lower channel, and the upper transistor can have an upper gate region that wraps around the upper channel. In another embodiment, the upper gate region of the upper transistor can be electrically connected to the lower gate region of the lower transistor. For example, the lower transistor and the upper transistor can be formed by removing the lower semiconductor layer of the lower stack and the upper semiconductor layer of the upper stack within the transistor area to uncover the lower doped first-type semiconductor layer of the lower doped semiconductor layer and the upper doped first-type semiconductor layer of the upper doped semiconductor layer, forming a first high-k dielectric layer to wrap around the lower doped first-type semiconductor layer of the lower doped semiconductor layer and the upper doped first-type semiconductor layer of the upper doped semiconductor layer that are uncovered as the lower gate region and the upper gate region, respectively, and forming a first metal layer to fill spaces that are generated after the lower semiconductor layer of the lower stack and the upper semiconductor layer of the upper stack are removed and the first high-k dielectric layer is formed to electrically connect the lower gate region to the upper gate region.

In an embodiment, the lower semiconductor layer can contain a single crystal material, and the lower doped semiconductor layer can be epitaxially formed on the lower semiconductor layer. In another embodiment, the capacitor area can be longer than the transistor area in a direction extending from the transistor area to the capacitor area.

In an embodiment, the lower capacitor can further have a lower charge storage layer that wraps around the first lower plate, and the upper capacitor can further have an upper charge storage layer that wraps around the first upper plate. In another embodiment, the lower capacitor can further have a second lower plate that wraps around the lower charge storage layer, and the upper capacitor can further have a second upper plate that wraps around the upper charge storage layer. For example, the second upper plate of the upper capacitor can be electrically connected to the second lower plate of the lower capacitor. As another example, the lower capacitor and the upper capacitor can be formed by removing the lower semiconductor layer of the lower stack and the upper semiconductor layer of the upper stack within the capacitor area to uncover the lower doped second-type semiconductor layer of the lower doped semiconductor layer and the upper doped second-type semiconductor layer of the upper doped semiconductor layer as the first lower plate and the first upper plate, respectively, forming a second high-k dielectric layer to wrap around the lower doped second-type semiconductor layer of the lower doped semiconductor layer and the upper doped second-type semiconductor layer of the upper doped semiconductor layer that are uncovered as the lower charge storage layer and the upper charge storage layer, respectively, and forming a second metal layer to fill spaces that are generated after the lower semiconductor layer of the lower stack and the upper semiconductor layer of the upper stack are removed and the second high-k dielectric layer is formed as the second lower plate and the second upper plate.

Aspects of the present disclosure provide a semiconductor structure. For example, the semiconductor structure can include a lower transistor including a lower channel that is elongated horizontally and includes a lower doped first-type semiconductor layer of a lower doped semiconductor layer, and an upper transistor vertically stacked over the lower transistor and including an upper channel that is elongated horizontally and includes an upper doped first-type semiconductor layer of an upper doped semiconductor layer. The semiconductor structure can also include a lower capacitor electrically connected to and horizontally elongated from the lower transistor, the lower capacitor including a first lower plate that includes a lower doped second-type semiconductor layer of the lower doped semiconductor layer, a lower charge storage layer that wraps around the first lower plate, and a second lower plate that wraps arounds the lower charge storage layer. The semiconductor structure can also include an upper capacitor vertically stacked over the lower capacitor and electrically connected to and horizontally elongated from the upper transistor, the upper capacitor including a first upper plate that includes an upper doped second-type semiconductor layer of the upper doped semiconductor layer, an upper charge storage layer that wraps around the first upper plate, and a second upper plate that wraps around the upper charge storage layer.

In an embodiment, the first lower plate of the lower capacitor can be electrically connected to and in-plane with the lower channel of the lower transistor, and the first upper plate of the upper capacitor can be electrically connected to and in-plane with the upper channel of the upper transistor. In another embodiment, the second upper plate and the second lower plate can be electrically connected to each other. In some embodiments, the lower transistor can further include a lower gate region that wraps around the lower channel, and the upper transistor can further include an upper gate region that wraps around the upper channel. For example, the upper gate region and the lower gate region can be electrically connected to each other. As another example, the semiconductor structure can further include a metal layer that wraps around the lower gate region of the lower transistor and the upper gate region of the upper transistor.

In an embodiment, the lower charge storage layer of the lower capacitor can be in-plane with the lower gate region of the lower transistor, and the upper charge storage layer of the upper capacitor can be in-plane with the upper gate region of the upper transistor. In another embodiment, the lower capacitor can further include one or more lower pillars that separate the second lower plate.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 1A-24A show schematic top views of various intermediary steps of an exemplary method for fabricating a semiconductor structure according to the some embodiments of the present disclosure;

FIGS. 1B-24B show cross-sectional views of the semiconductor structure along cut lines BB' shown in FIGS. 1A-24A, respectively, according to the some embodiments of the present disclosure;

FIGS. 9C-24C show cross-sectional views of the semiconductor structure along cut lines CC' shown in FIGS. 9A-24A, respectively, according to the some embodiments of the present disclosure; and FIGS. 9D-24D show cross-sectional views of the semiconductor structure along cut lines DD' shown in FIGS. 9A-24A, respectively, according to the some embodiments of the present disclosure.

DETAILED DESCRIPTION

Figure 1A:
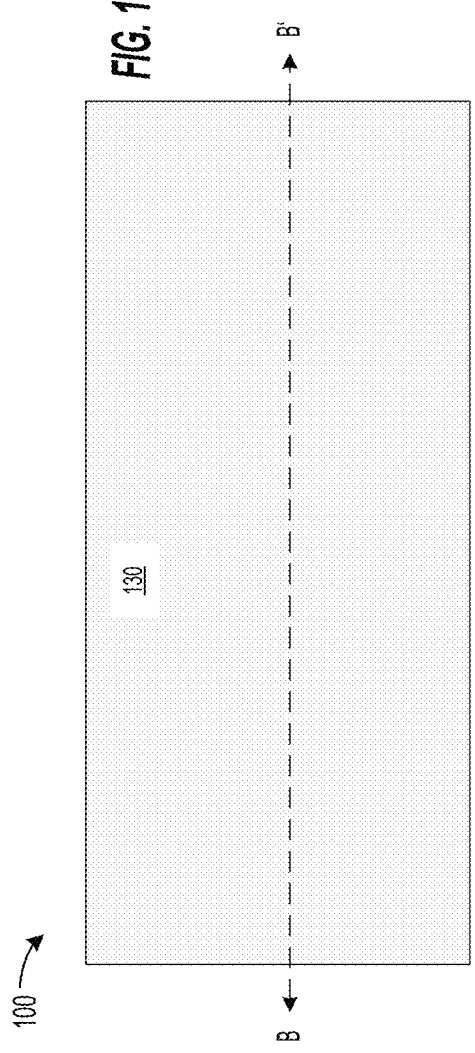

Three-dimensional (3D) integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips, e.g., central processing units (CPUs), graphics processing units (GPUs), field programmable gate arrays (FPGAs) and system on a chip (SoC), is being pursued.

Techniques herein provide horizontal DRAM access with Silicon Nano sheet Transistor and Highly doped Si Capacitor. An access transistor is provided that is single crystal silicon, which results in high performance Idsat and robust Idoff. By making a stack of horizontal 3D stacked DRAM cells a significant improvement in circuit density is obtained. Embodiments include a Horizontal 3D DRAM stack N cells tall that can be integrated side by side, and CFET stacks because process is compatible with Si/SiGe/Si/SiGe . . . Nano sheet flow. Conventional vertical stacked DRAM stacked capacitors require aspect ratios of >150:1 and dielectric constants of around 70 in a few years. Thus stacking just a few planar DRAM cells vertically is difficult. Techniques herein, however, solve this with a build of a Horizontal DRAM cell that may be stacked 3D to produce claim of N stacked horizontal DRAM builds. Features include metal-oxide all around Highly doped Si capacitor. Embodiments are highly suitable for hierarchical design of n-number stacks. All gate metals are shorted vertically with individual Nano sheet pass transistors. All capacitor metal can have common ground connection.

FIGS. 1A-24A show schematic top views of various intermediary steps of an exemplary method for fabricating a semiconductor structure 100 according to the some embodiments of the present disclosure. The semiconductor structure 100 can include 3D silicon nanosheet memories with capacitors. For example, the semiconductor structure 100 can include one or more vertically stacked horizontal dynamic random access memories (DRAMs) access with silicon nanosheet transistors and capacitors. In an embodiment, all gate metal are shorted vertically with individual nanosheet transistors, and all non-terminal capacitor metal plates, i.e., the terminals not connected to the nanosheet transistors, have common ground connection. FIGS. 1B-24B show cross-sectional views of the semiconductor structure 100 along cut lines BB' shown in FIGS. 1A-24A, respectively, according to the some embodiments of the present disclosure. FIGS. 9C-24C show cross-sectional views of the semiconductor structure 100 along cut lines CC' shown in FIGS. 9A-24A, respectively, according to the some embodiments of the present disclosure. FIGS. 9D-24D show cross-sectional views of the semiconductor structure 100 along cut lines DD' shown in FIGS. 9A-24A, respectively, according to the some embodiments of the present disclosure.

Figure 1B:
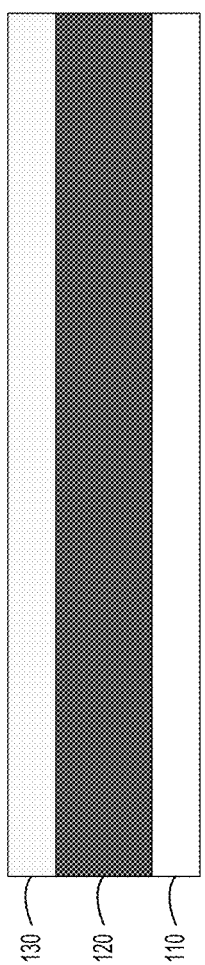

As shown in FIGS. 1A and 1B, a substrate 110 is provided. The substrate 110 can include a Si or SiGe substrate. In an embodiment, the substrate 110 can be a lightly doped p-type silicon substrate. Two different mole fractions of SiGe are epitaxially grown on the substrate 110 sequentially. In an embodiment, a comparatively thick first SiGe layer 120, e.g., made of SiGe90, can be epitaxially grown on the substrate 110, and a second SiGe layer 130 that is different from the first SiGe layer 120, e.g., made of SiGe30, can be epitaxially grown on the first SiGe layer 120 to maintain the single crystallinity. The second SiGe layer 130 and the first SiGe layer 120 can be etched selectively with respect to each other. In an embodiment, the first SiGe layer 120 is used to replace with an insulation layer in future process steps to keep the nanosheet transistors isolated from the substrate 110.

As shown in FIGS. 2A and 2B, an etch mask or photo resist layer 210, e.g., a pillar mask, is patterned and formed on the second SiGe layer 130, with a portion of the second SiGe layer 130 uncovered, and the semiconductor structure 100 is directionally etched through the uncovered portion of the second SiGe layer 130 and the first SiGe layer 120 until uncovering a top surface (e.g., a working surface) of the substrate 110. In an embodiment, a slight portion of the substrate 110 can also be etched directionally.

As shown in FIGS. 3A and 3B, the etch mask 210 is stripped off and removed, and a first dielectric layer 310, e.g., made of a first dielectric material, is deposited to fill spaces that are generated after the uncovered portion of the second SiGe layer 130 and the first SiGe layer 120 are removed. A chemical-mechanical polishing (CMP) process can then be performed to remove the overburden of the first dielectric material and planarize the first dielectric layer 310 and the second SiGe layer 130. The first dielectric layer 310 can be used as pillars that give support to the whole semiconductor structure 100 at the time of removing the bottom first SiGe layer 120, e.g., the SiGe90, at a later stage.

Figure 4A:
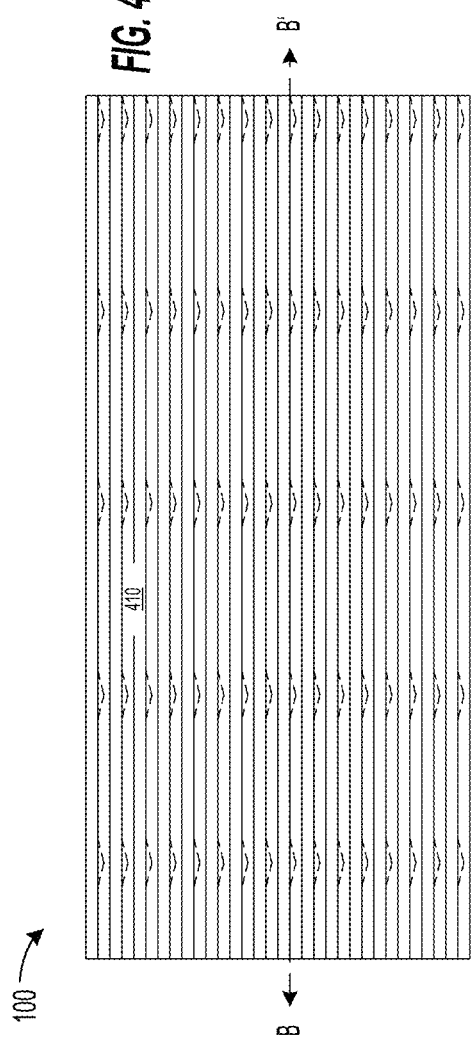
Figure 4B:
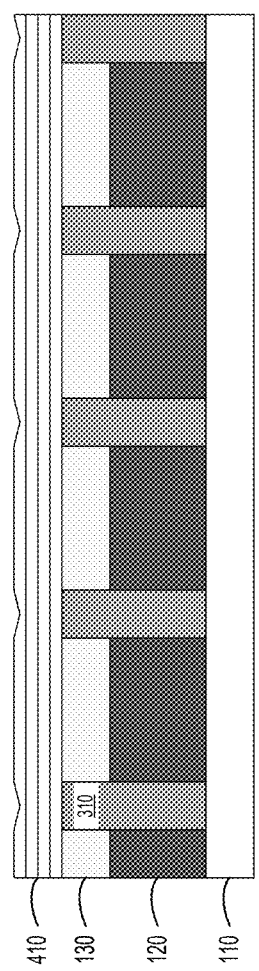

As shown in FIGS. 4A and 4B, a first lightly doped first-type (e.g., p-type) Si layer 410 is epitaxially grown on the second SiGe layer 130 and the first dielectric layer 310. As the first dielectric layer 310 will not support much epi-growth, the first lightly doped p-type Si layer 410 may include a couple of concave portions that are above the first dielectric layer 310. In an embodiment, the first lightly doped p-type Si layer 410 can be made thicker such that the concave portions can be filled up. Some amount of boundary can be acceptable because those areas belong to the capacitor which will be doped highly in next step. Other than that the channel area with source and drain is single crystal without any grain boundaries.

Figure 5A:
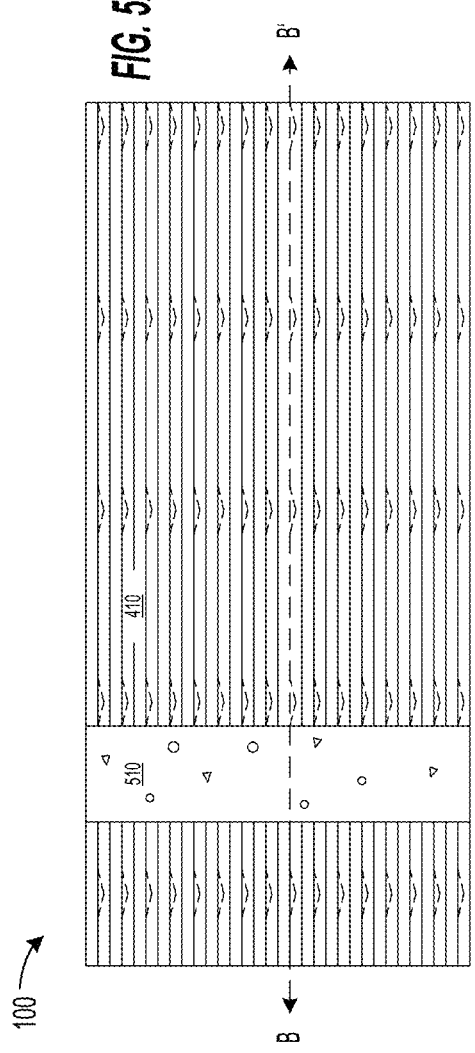
Figure 5B:
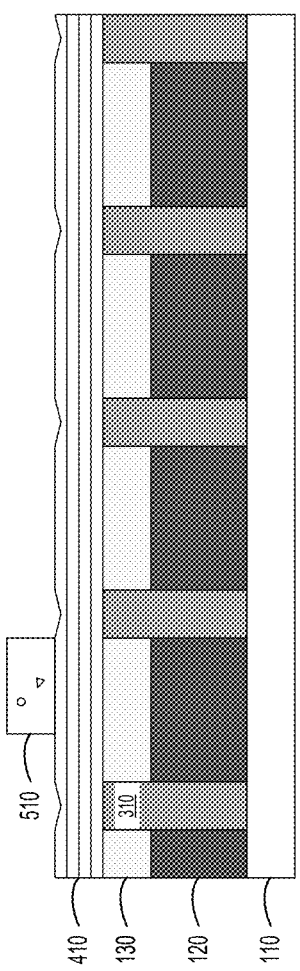

As shown in FIGS. 5A and 5B, an etch mask or photo resist layer 510, e.g., a channel mask, is patterned and formed on the first lightly doped p-type Si layer 410, with a portion of the first lightly doped p-type Si layer 410 uncovered.

As shown in FIGS. 6A and 6B, the portion of the first lightly doped p-type Si layer 410 that is not covered by the etch mask 510 is highly doped with second-type (e.g., n-type) Si to form a first highly doped n-type Si layer 610. Then, the etch mask 510 is stripped off and removed.

Figure 7A:
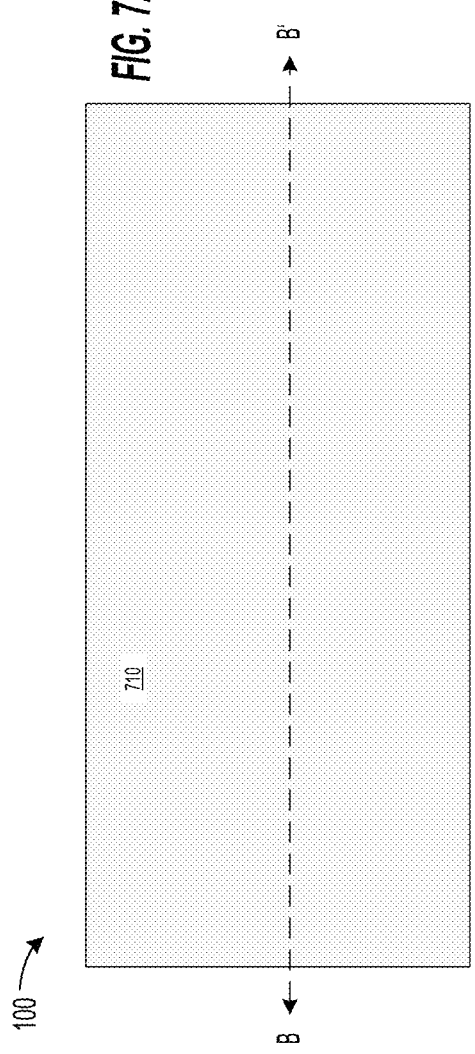
Figure 7B:
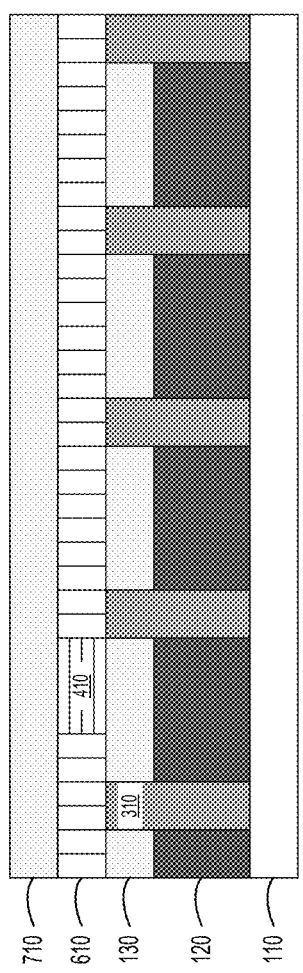
Figure 16A:
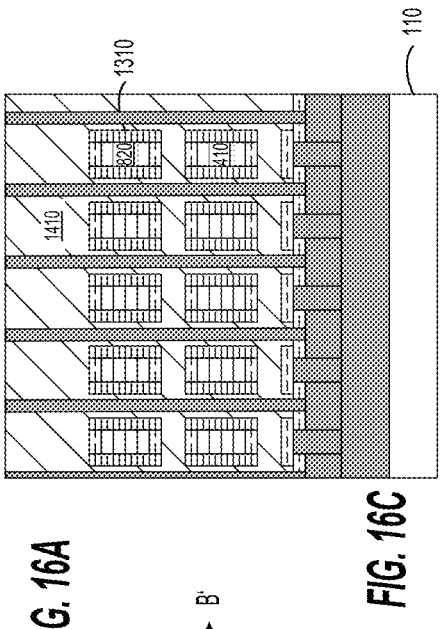
Figure 16B:
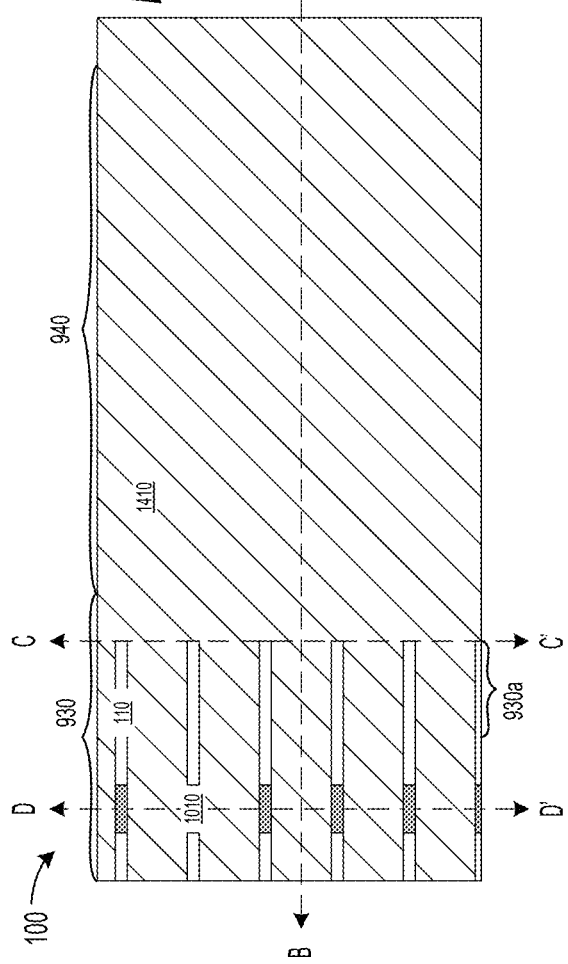
Figure 16C:
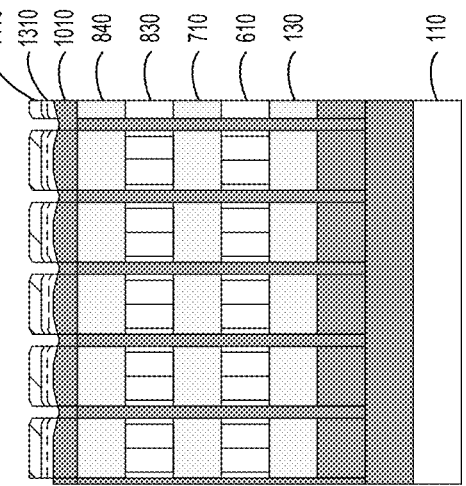
Figure 16D:
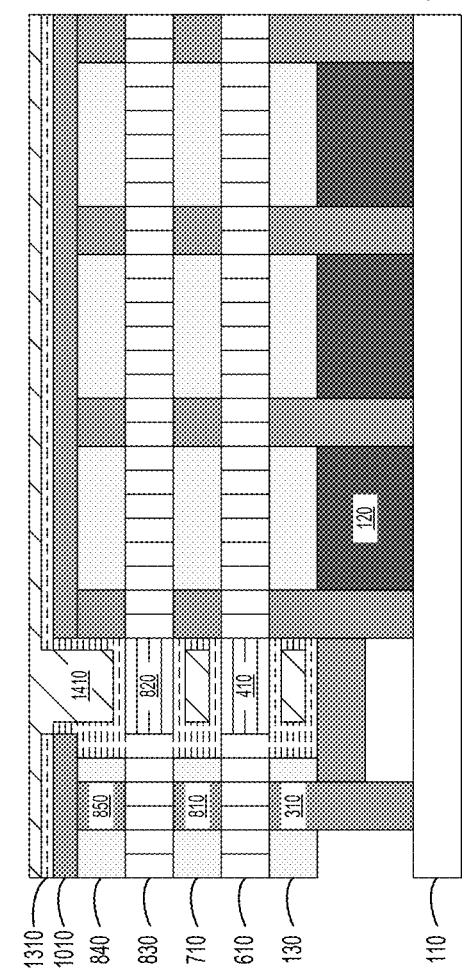
Figure 17A:
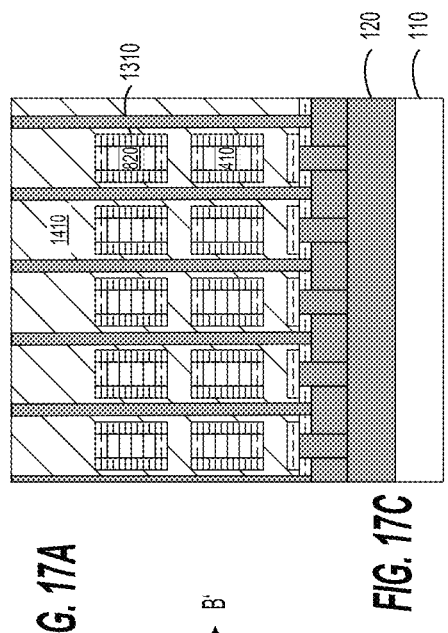
Figure 17C:
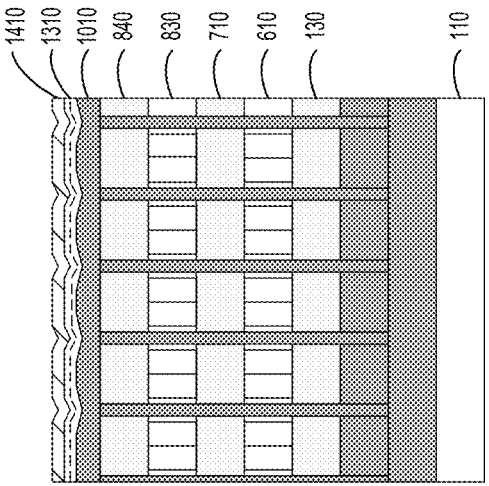
Figure 17B:
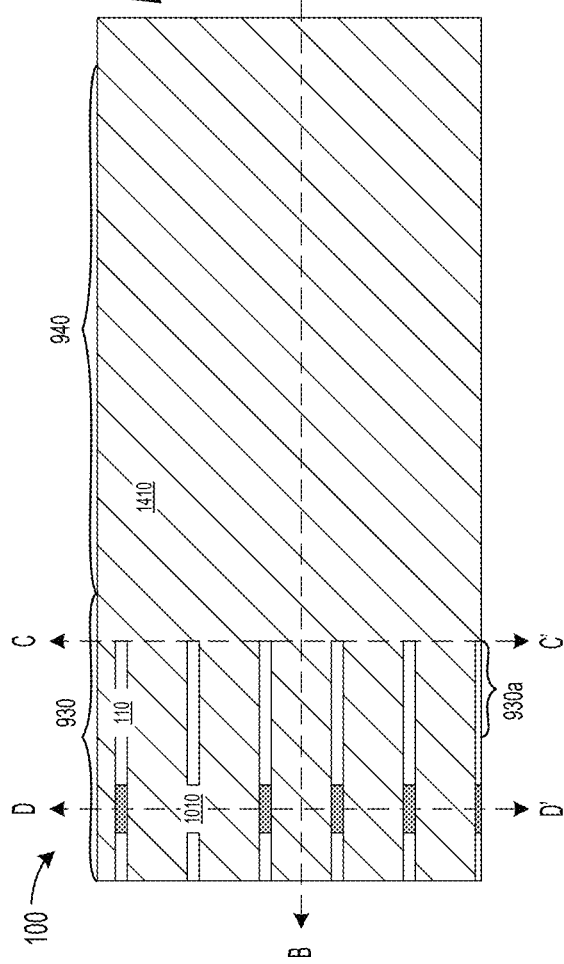
Figure 17D:
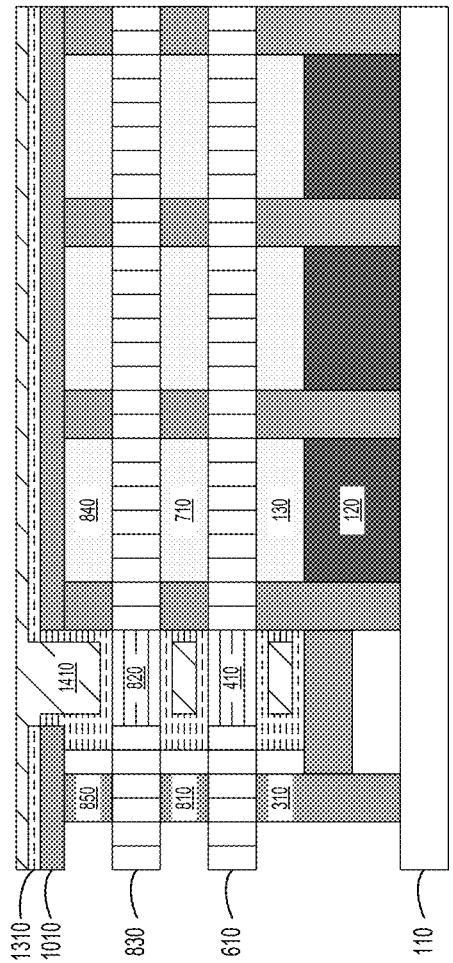
Figure 18C:
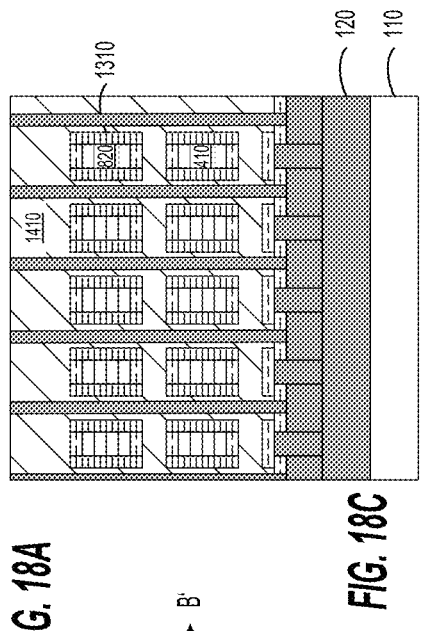
Figure 18D:
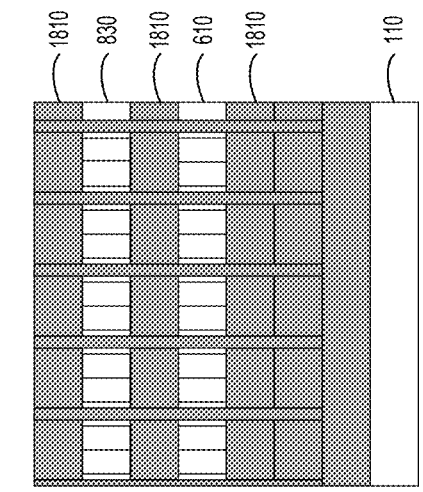
Figure 18A:
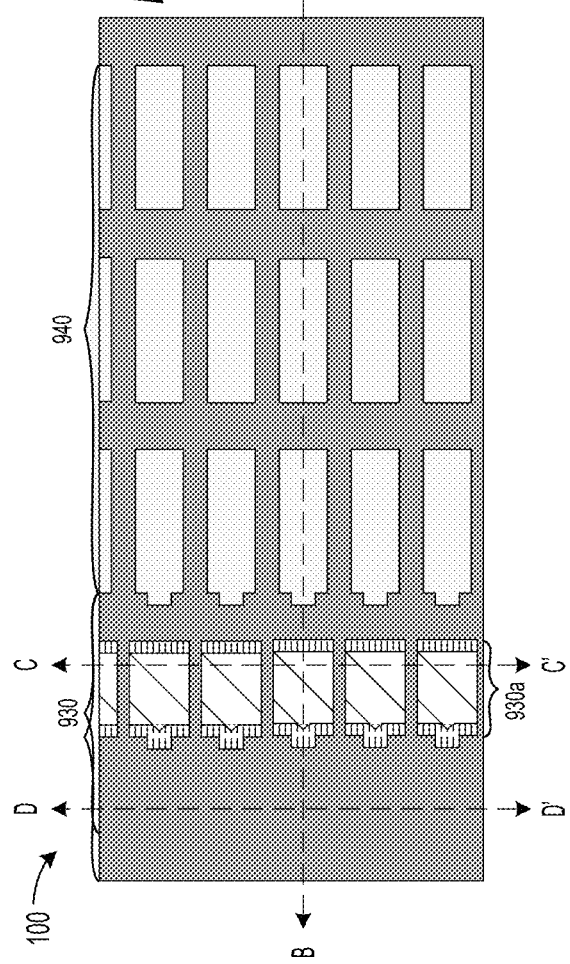
Figure 18B:
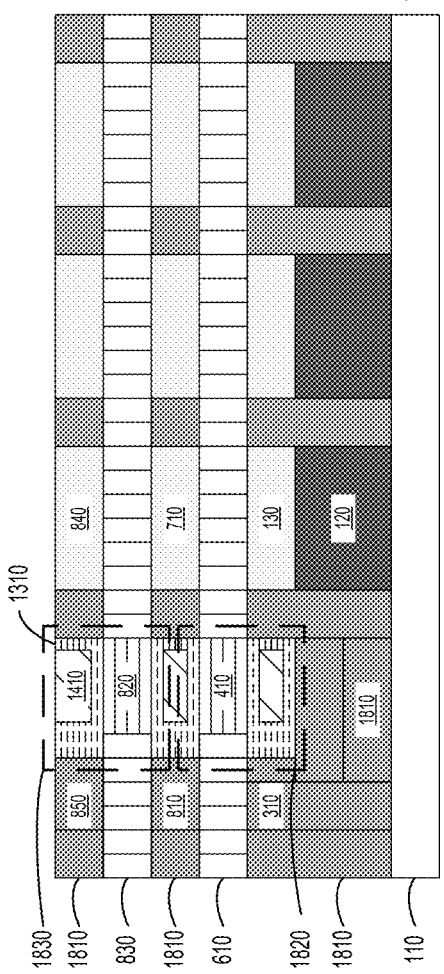
Figure 19C:
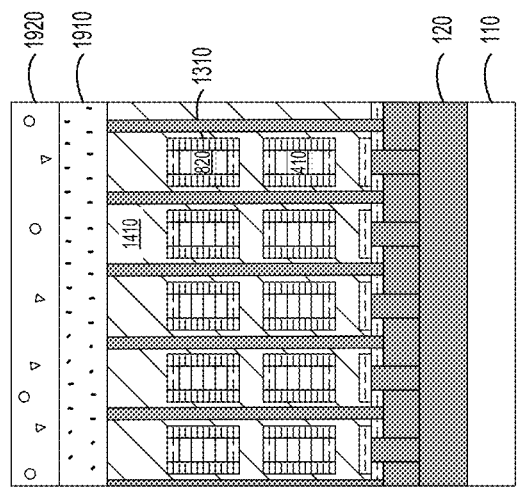
Figure 19D:
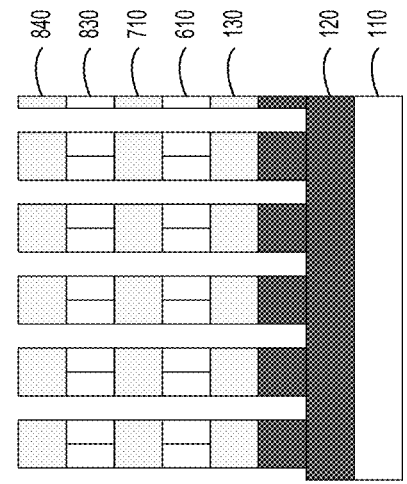
Figure 19A:
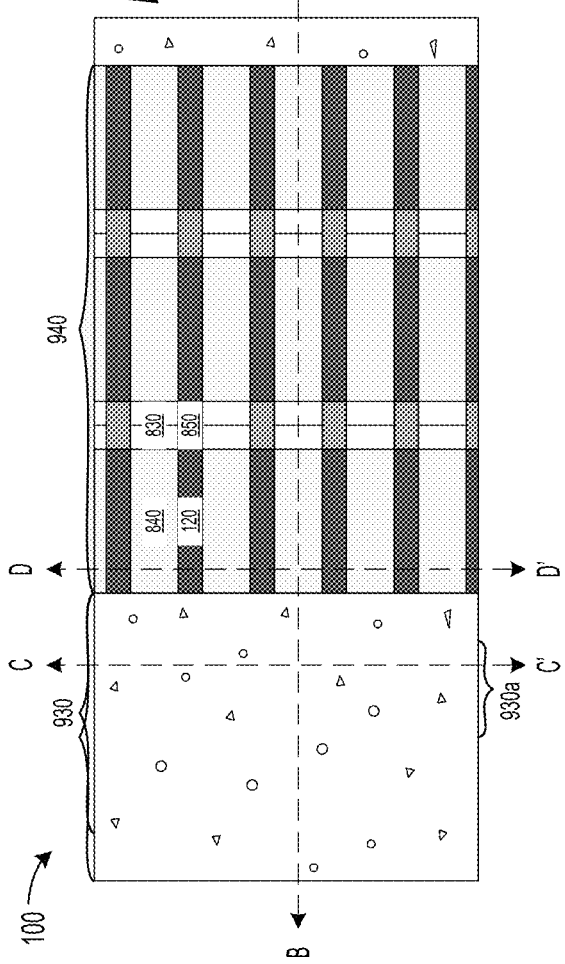
Figure 19B:
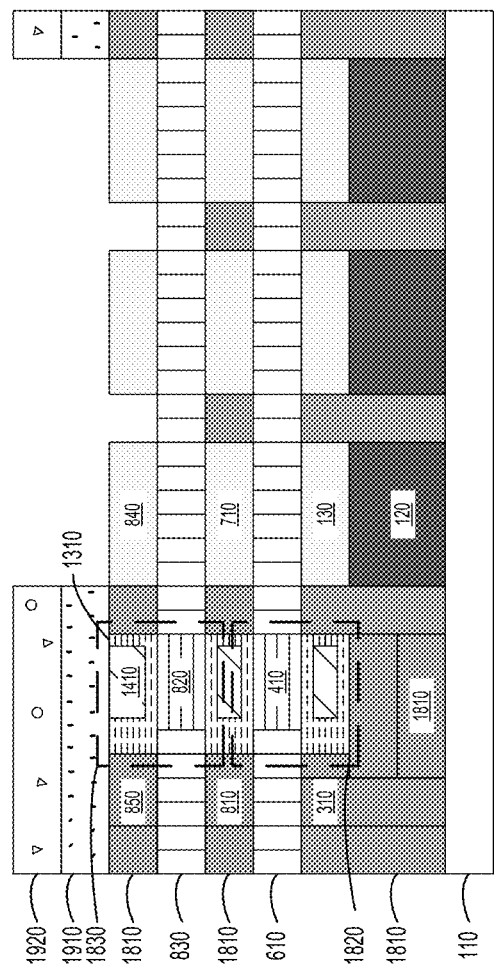
Figure 21A:
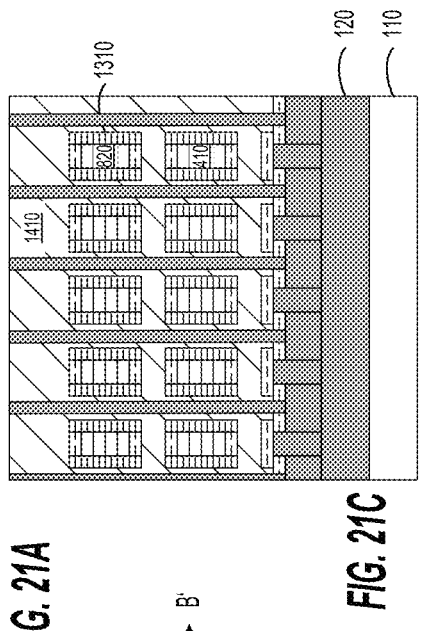
Figure 21C:
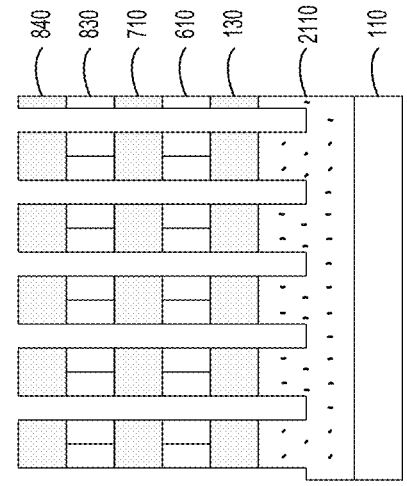
Figure 21B:
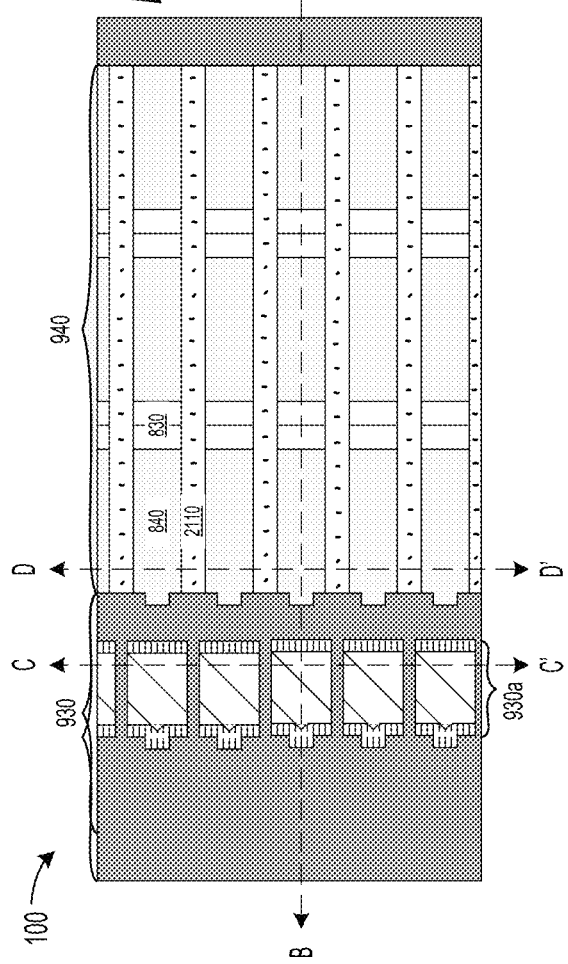
Figure 21D:
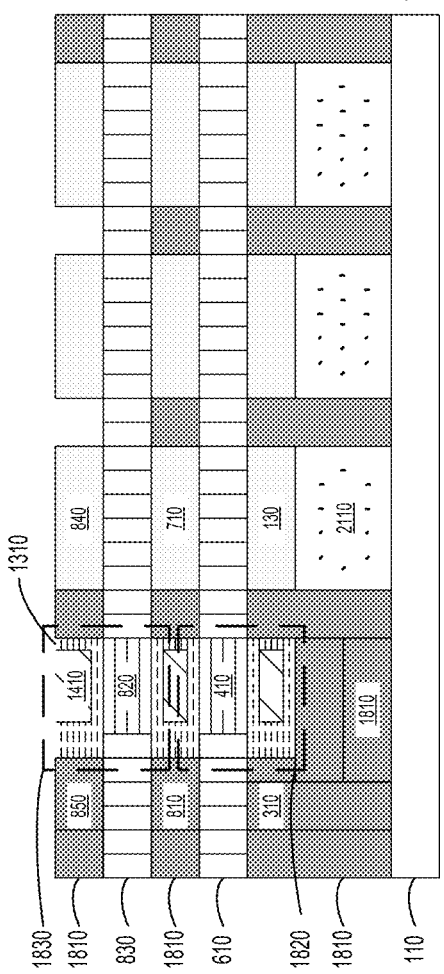
Figure 22C:
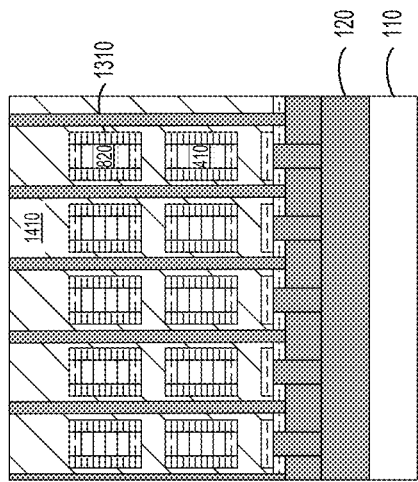
Figure 22D:
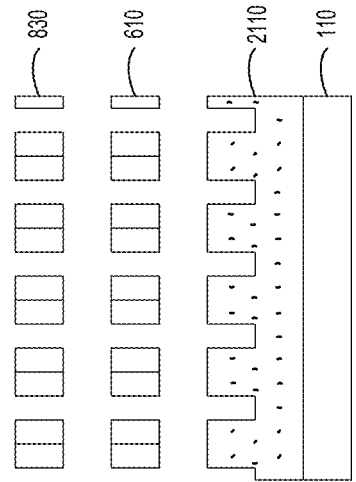
Figure 22A:
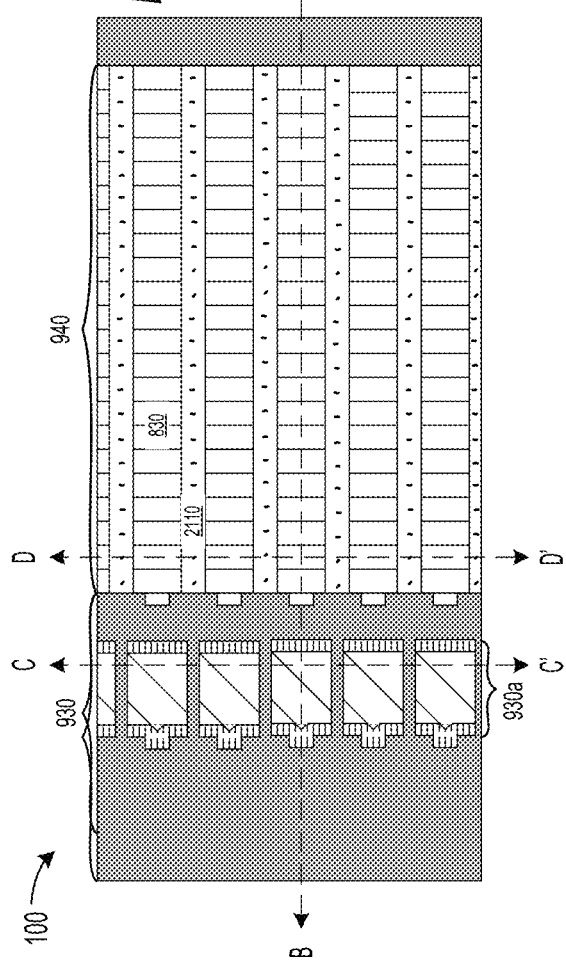
Figure 22B:
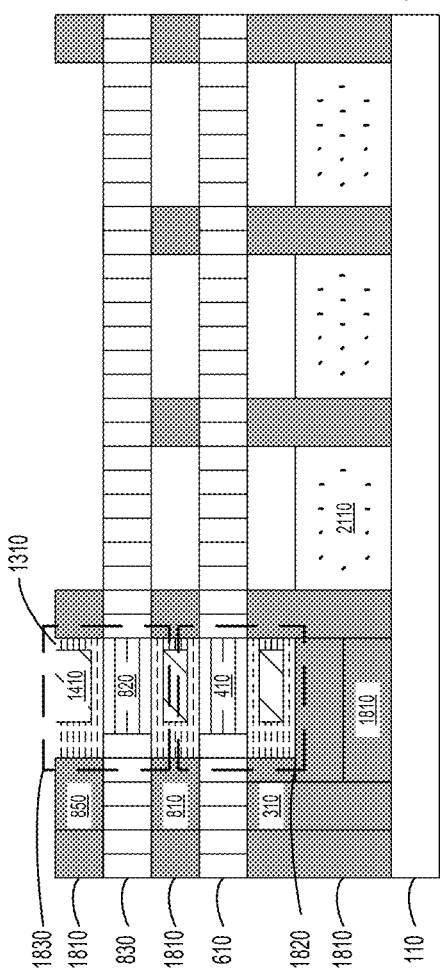

As shown in FIGS. 7A and 7B, a third SiGe layer 710, e.g., made of SiGe30, is epitaxially grown on the first lightly doped p-type Si layer 410 and the first highly doped n-type Si layer 610.

As shown in FIGS. 8A and 8B, a second dielectric layer 810, e.g., made of the first dielectric material, a second lightly doped p-type Si layer 820, a second highly doped n-type Si layer 830, a fourth SiGe layer 840, e.g., made of SiGe30, and a third dielectric layer 850, e.g., made of the first dielectric material, can be formed by repeating the process steps shown in FIGS. 2A, 2B, 3A, 3B, 4A, 4B, 5A, 5B, 6A and 6B, to finish the p-type Si, its corresponding implantation, SiGe30 and pillar lithography. The second dielectric layer 810 is also used as pillars that give support to the whole semiconductor structure 100 at the time of removing the bottom first SiGe layer 120, e.g., the SiGe90, at a later stage. In the example embodiment, the semiconductor structure 100 includes two stacks of Si and SiGe30 layers. For n stacks, the additional Si and SiGe30 layers can be repeated accordingly. In the example embodiment, the semiconductor structure 100 includes only one of the SiGe90, i.e., the first SiGe layer 120, which is formed at the bottom most above the substrate 110. In an embodiment, the semiconductor structure 100 can include more than one of the SiGe90 and one or more than one of the SiGe90 can be inserted in between the SiGe30 if any discontinuity is needed in the semiconductor structure 100.

As shown in FIGS. 9A-9D, an etch mask or photo resist layer 910, e.g., a DRAM slicing mask, is formed to cover the fourth SiGe layer 840 and the third dielectric layer 850, and the semiconductor structure 100 is directionally etched through a portion of the two stacks of Si and SiGe30 layers that is not covered by the etch mask 910, stopping at the first SiGe layer 120, i.e., SiGe90. In the example embodiment, a portion of the first SiGe layer 120 can also be directionally etched. In an embodiment, the semiconductor structure 100 includes a nanosheet transistor area (or transistor area) 930 and a capacitor area 940 that can be longer than the nanosheet transistor area 930 in order for a higher capacitor value.

As shown in FIGS. 10A-10D, the etch mask 910 is stripped off and removed, and a fourth dielectric layer 1010, e.g., made of the first dielectric material, is deposited to fill spaces that are generated after the portion of the two stacks of Si and SiGe30 is removed.

As shown in FIGS. 11A-11D, an etch mask or photo resist layer 1110, e.g., a nanosheet transistor mask, is patterned and formed on the fourth dielectric layer 1010, with a central portion 930a of the nanosheet transistor area 930 uncovered, and the semiconductor structure 100 within the central portion 930a of the nanosheet transistor area 930 is directionally etched through the fourth dielectric layer 1010 to remove the fourth dielectric layer 1010, which is made of the first dielectric material, until uncovering the first SiGe layer 120, which is made of SiGe90, and the fourth SiGe layer 840, the third SiGe layer 710 and the second SiGe layer 130, which are made of SiGe30, to form trenches that access to the SiGe30.

As shown in FIGS. 12A-12D, the etch mask 1110 is stripped off and removed, and the fourth SiGe layer 840, the third SiGe layer 710 and the second SiGe layer 130 within the central portion 930a of the nanosheet transistor area 930, which are etched selectively with respect to the first SiGe layer 120, are etched and removed to uncover the first lightly doped p-type Si layer 410 and the second lightly doped p-type Si layer 820. In an embodiment, the SiGe30, i.e., the fourth SiGe layer 840, the third SiGe layer 710 and the second SiGe layer 130, can be removed by vapor-phase isotropic etching.

As shown in FIGS. 13A-13D, a thin first high-k dielectric layer 1310 is formed in a conformal deposition process, e.g., an atomic layer deposition (ALD) process, to wrap around the first lightly doped p-type Si layer 410 and the second lightly doped p-type Si layer 820, which are used as channels of the nanosheet transistors of the semiconductor structure 100. The ALD process is often performed at a low temperature, which makes less or even no damages on the components already fabricated, and can provide ultra-thin nano-layers in a precise manner on the first lightly doped p-type Si layer 410 and the second lightly doped p-type Si layer 820.

As shown in FIGS. 14A-14D, a first metal layer 1410 is deposited and formed on the first high-k dielectric layer 1310.

As shown in FIGS. 15A-15D, an etch mask or photo resist layer 1510, e.g., a DRAM slicing mask, is formed on the first metal layer 1410, and the semiconductor structure 100 is directionally etched through the first metal layer 1410 and the first high-k dielectric layer 1310 to uncover the SiGe90, i.e., the first SiGe layer 120. This etch opens access to the first SiGe layer 120.

As shown in FIGS. 16A-16D, the first SiGe layer 120, i.e., the SiGe90, is etched and removed. The etch mask 1510 can also be stripped off and removed.

As shown in FIGS. 17A-17D, the SiGe 30, i.e., the second SiGe layer 130, the third SiGe layer 710 and the fourth SiGe layer 840 remained within the nanosheet transistor area 930, is etched and removed, which can short the nanosheet transistors in source regions.

As shown in FIGS. 18A-18D, a fifth dielectric layer 1810, e.g., made of the first dielectric material, fills spaces that are generated after the SiGe90, i.e., the first SiGe layer 120, and the SiGe30, i.e., the second SiGe layer 130, the third SiGe layer 710 and the fourth SiGe layer 840, are removed. Then the first metal layer 1410, the first high-k dielectric layer 1310 and the fourth dielectric layer 1010 over the fourth SiGe layer 840 and the third dielectric layer 850, which is used as pillars, can be removed, and the CMP process can then be performed to planarize the top surface of the semiconductor structure 100.

The semiconductor structure 100 thus fabricated can include a (gate-all-around (GAA)) lower (or first) nanosheet transistor 1820 and an (GAA) upper (or second) nanosheet transistor 1830 that is stacked over the lower nanosheet transistor 1820. The lower nanosheet transistor 1820 includes a channel, i.e., the first lightly doped p-type Si layer 410, a gate region, i.e., the first high-k dielectric layer 1310, which wraps around the channel and is wrapped around by the first metal layer 1410, which can act as a gate electrode of the lower nanosheet transistor 1820, and source/drain (S/D) regions, i.e., two ends of the first lightly doped p-type Si layer 410, that are electrically connected to the first highly doped n-type Si layer 610, which can act as S/D electrodes of the lower nanosheet transistor 1820. The fifth dielectric layer 1810 can insulate the lower nanosheet transistor 1820 from the substrate 110. The upper nanosheet transistor 1830 includes a channel, i.e., the second lightly doped p-type Si layer 820, a gate region, i.e., the first high-k dielectric layer 1310, which wraps around the channel and is wrapped around by the first metal layer 1410, which can act as a gate electrode of the upper nanosheet transistor 1830, and S/D regions, i.e., two ends of the second lightly doped p-type Si layer 820, that are electrically connected to the second highly doped n-type Si layer 830, which can act as S/D electrodes of the upper nanosheet transistor 1830. The gate regions of the lower nanosheet transistor 1820 and the upper nanosheet transistor 1830 are shorted by the first metal layer 1410. Since the lower nanosheet transistor 1820 and the upper nanosheet transistor 1830 are single crystal silicon, high performance Idsat and robust $Id_{off}$ can be achieved.

As shown in FIGS. 19A-19D, a hard mask 1910, e.g., made of a second dielectric material, is deposited and formed on the top surface of the semiconductor structure 100. An etch mask or photo resist layer 1920, e.g., a capacitor mask, is formed to cover the hard mask 1910, with a portion of the hard mask 1910 within the capacitor area 940 uncovered, and the semiconductor structure 100 is directionally etched to remove the hard mask 1910 and the fourth dielectric layer 1010 (shown in FIGS. 10A-10D) to uncover the SiGe90, i.e., the first SiGe layer 120. In an embodiment, this etch can proceed until uncovering the top surface of the substrate 110. This etch opens access to the first SiGe layer 120.

As shown in FIGS. 20A-20D, the etch mask 1920 is stripped off and removed, and the first SiGe layer 120 within the capacitor area 940 is removed to uncover the top surface of the substrate 110. At this point, the pillars, i.e., the first dielectric layer 310 and the second dielectric layer 810, can provide physical/mechanical support to the whole capacitor structure of the semiconductor structure 100.

As shown in FIGS. 21A-21D, a sixth dielectric layer 2110, e.g., made of the second dielectric material, fills spaces that are generated after the SiGe90, i.e., the first SiGe layer 120, and the fourth dielectric layer 1010 are removed. Then the hard mask 1910 can be removed. The sixth dielectric layer 2110, which is made of the second dielectric material, can be directionally etched to uncover the SiGe30, i.e., the second SiGe layer 130, the third SiGe layer 710 and the fourth SiGe layer 840. In an embodiment, the second dielectric material and the first dielectric material can be etched selectively with respect to each other. This etch can proceed until uncovering the top surface of the substrate 110.

As shown in FIGS. 22A-22D, the SiGe30, i.e., the second SiGe layer 130, the third SiGe layer 710 and the fourth SiGe layer 840 within the capacitor area 940, are removed to uncover the first lightly doped n-type Si layer 610 and the second lightly doped n-type Si layer 830 within the capacitor area 940.

As shown in FIGS. 23A-23D, a thin second high-k dielectric layer 2310 is formed in a conformal deposition process, e.g., the ALD process, to wrap around the uncovered the first lightly doped n-type Si layer 610 and the second lightly doped n-type Si layer 830.

As shown in FIGS. 24A-24D, a second metal layer 2410 is deposited to fill spaces that are generated after the second SiGe layer 130, the third SiGe layer 710 and the fourth SiGe layer 840 are removed and the second high-k dielectric layer 2310 is formed, and thus wraps around the second high-k dielectric layer 2310 and the first lightly doped n-type Si layer 610 and the second lightly doped n-type silicon layer 830 as well. The CMP process can then be performed to remove the second high-k dielectric layer 2310 over the semiconductor structure 100.

The semiconductor structure 100 thus further fabricated can further include a lower capacitor 2420 and an upper capacitor 2430 that is stacked over the lower capacitor 2420. The lower capacitor 2420 is electrically connected to the lower nanosheet transistor 1820 horizontally, and includes a first lower plate 2420a, i.e., the first highly doped n-type Si layer 610, that is electrically connected to the S/D electrodes of the lower nanosheet transistor 1820, a second lower plate (or non-terminal plate) 2420b, i.e., the second metal layer 2410, that is isolated by the first dielectric layer 310 from the lower nanosheet transistor 1820 and is not electrically connected to the lower nanosheet transistor 1820, and a lower dielectric layer (or a lower charge storage layer) 2420c, i.e., the second high-k dielectric layer 2310, that is sandwiched between the first lower plate 2420a and the second lower plate 2420b for storing electrical charges flowing from the lower nanosheet transistor 1820. The upper capacitor 2430 is electrically connected to the upper nanosheet transistor 1830 horizontally, and includes a first upper plate 2430a, i.e., the second highly doped n-type Si layer 830, that is electrically connected to the S/D electrodes of the upper nanosheet transistor 1830, a second upper plate (or non-terminal plate) 2430b, i.e., the second metal layer 2410, that is isolated by the third dielectric layer 850 from the upper nanosheet transistor 1830 and is not electrically connected to the upper nanosheet transistor 1830, and an upper dielectric layer (or an upper charge storage layer) 2430c, i.e., the second high-k dielectric layer 2310, that is sandwiched between the first upper plate 2430a and the second upper plate 2430b for storing electrical charges flowing from the upper nanosheet transistor 1830. The non-terminal plates of the lower capacitor 2420 and the upper capacitor 2430, i.e., the second lower plate 2420b and the second upper plate 2430b, can be electrically connected, e.g., by the second metal layer 2410, and have common ground connection and be shorted to a common ground.

Since the semiconductor structure 100 includes the lower nanosheet transistor 1820 and the upper nanosheet transistor 1830 that are single crystal silicon, high performance Idsat and robust $Id_{off}$ can be achieved. As the semiconductor structure 100 includes DRAMs that are vertically stacked over one another, a significant improvement in circuit density can be obtained.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order.

Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method for fabricating a semiconductor structure, comprising:

forming over a substrate a lower stack of a lower semiconductor layer and a lower doped semiconductor layer stacked over the lower semiconductor layer, the lower semiconductor layer and the lower doped semiconductor layer being parallel to a top surface of the substrate, the lower doped semiconductor layer including a lower doped first-type semiconductor layer and a lower doped second-type semiconductor layer within a transistor area and a capacitor area of the semiconductor structure, respectively, the lower semiconductor layer having one or more lower pillars;

forming over the lower stack an upper stack of an upper semiconductor layer and an upper doped semiconductor layer stacked over the upper semiconductor layer, the upper semiconductor layer and the upper doped semiconductor layer being parallel to the top surface of the substrate, the upper doped semiconductor layer including an upper doped first-type semiconductor layer and an upper doped second-type semiconductor layer within the transistor area and the capacitor area of the semiconductor structure, respectively, the upper semiconductor layer having one or more upper pillars;

forming over the substrate a lower transistor within the transistor area, the lower transistor including the lower doped first-type semiconductor layer as a lower channel thereof;

forming over the lower transistor an upper transistor within the transistor area, the upper transistor including the upper doped first-type semiconductor layer as an upper channel thereof;

forming over the substrate a lower capacitor within the capacitor area, the lower capacitor including the lower doped second-type semiconductor layer as a first lower plate thereof; and forming over the lower capacitor an upper capacitor within the capacitor area, the upper capacitor including the upper doped second-type semiconductor layer as a first upper plate thereof.

2. The method of claim 1, wherein the lower transistor has a lower gate region that wraps around the lower channel, and the upper transistor has an upper gate region that wraps around the upper channel.

3. The method of claim 2, wherein the upper gate region of the upper transistor is electrically connected to the lower gate region of the lower transistor.

4. The method of claim 3, wherein the lower transistor and the upper transistor are formed by:

removing the lower semiconductor layer of the lower stack and the upper semiconductor layer of the upper stack within the transistor area to uncover the lower doped first-type semiconductor layer of the lower doped semiconductor layer and the upper doped first-type semiconductor layer of the upper doped semiconductor layer;

forming a first high-k dielectric layer to wrap around the lower doped first-type semiconductor layer of the lower doped semiconductor layer and the upper doped first-type semiconductor layer of the upper doped semiconductor layer that are uncovered as the lower gate region and the upper gate region, respectively; and forming a first metal layer to fill spaces that are generated after the lower semiconductor layer of the lower stack and the upper semiconductor layer of the upper stack are removed and the first high-k dielectric layer is formed to electrically connect the lower gate region to the upper gate region.

5. The method of claim 1, wherein the lower semiconductor layer contains a single crystal material, and the lower doped semiconductor layer is epitaxially formed on the lower semiconductor layer.

6. The method of claim 1, wherein the capacitor area is longer than the transistor area in a direction extending from the transistor area to the capacitor area.

7. The method of claim 1, wherein the lower capacitor further has a lower charge storage layer that wraps around the first lower plate, and the upper capacitor further has an upper charge storage layer that wraps around the first upper plate.

8. The method of claim 7, wherein the lower capacitor further has a second lower plate that wraps around the lower charge storage layer, and the upper capacitor further has a second upper plate that wraps around the upper charge storage layer.

9. The method of claim 8, wherein the second upper plate of the upper capacitor is electrically connected to the second lower plate of the lower capacitor.

10. The method of claim 9, wherein the lower capacitor and the upper capacitor are formed by:

removing the lower semiconductor layer of the lower stack and the upper semiconductor layer of the upper stack within the capacitor area to uncover the lower doped second-type semiconductor layer of the lower doped semiconductor layer and the upper doped second-type semiconductor layer of the upper doped semiconductor layer as the first lower plate and the first upper plate, respectively;

forming a second high-k dielectric layer to wrap around the lower doped second-type semiconductor layer of the lower doped semiconductor layer and the upper doped second-type semiconductor layer of the upper doped semiconductor layer that are uncovered as the lower charge storage layer and the upper charge storage layer, respectively; and forming a second metal layer to fill spaces that are generated after the lower semiconductor layer of the lower stack and the upper semiconductor layer of the upper stack are removed and the second high-k dielectric layer is formed as the second lower plate and the second upper plate.

11. The method of claim 1, wherein the lower transistor is insulated from the substrate.

* * * * *